United States Patent
Sato et al.

(10) Patent No.: US 11,785,782 B1
(45) Date of Patent: Oct. 10, 2023

(54) EMBEDDED MEMORY WITH ENCAPSULATION LAYER ADJACENT TO A MEMORY STACK

(71) Applicant: Kepler Computing Inc., San Francisco, CA (US)

(72) Inventors: Noriyuki Sato, Hillsboro, OR (US); Tanay Gosavi, Portland, OR (US); Niloy Mukherjee, San Ramon, CA (US); Rajeev Kumar Dokania, Beaverton, OR (US); Amrita Mathuriya, Portland, OR (US); Sasikanth Manipatruni, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 133 days.

(21) Appl. No.: 17/346,094

(22) Filed: Jun. 11, 2021

Related U.S. Application Data

(63) Continuation of application No. 17/345,964, filed on Jun. 11, 2021.

(51) Int. Cl.
*H10B 53/40* (2023.01)

(52) U.S. Cl.
CPC .................... *H10B 53/40* (2023.02)

(58) Field of Classification Search
CPC ......... H10B 53/40; H10B 53/50; H10B 12/50
See application file for complete search history.

(56) References Cited

U.S. PATENT DOCUMENTS

| | | |
|---|---|---|
| 5,479,317 A | 12/1995 | Ramesh |
| 5,519,235 A | 5/1996 | Ramesh |

(Continued)

FOREIGN PATENT DOCUMENTS

| | | |
|---|---|---|
| JP | 10242426 | 9/1998 |
| TW | 200403814 A | 3/2004 |

(Continued)

OTHER PUBLICATIONS

Non-Final Office Action dated Dec. 2, 2022 for U.S. Appl. No. 17/654,521.

(Continued)

*Primary Examiner* — Allison Bernstein
(74) *Attorney, Agent, or Firm* — MUGHAL GAUDRY & FRANKLIN PC

(57) ABSTRACT

A process integration and patterning flow used to pattern a memory array area for an embedded memory without perturbing a fabricating process for logic circuitries. The fabrication process uses a pocket mask (e.g., a hard mask) to decouple the etching process of a memory array area and non-memory area. Such decoupling allows for a simpler fabrication process with little to no impact on the current fabrication process. The fabrication process may use multiple pocket masks to decouple the etching process of the memory array area and the non-memory area. This fabrication process (using multiple pocket masks) allows to avoid exposure of memory material into a second pocket etch chamber. The process of etching memory material is decoupled from the process of etching an encapsulation material. Examples of embedded memory include dynamic random-access memory and ferroelectric random-access memory.

19 Claims, 27 Drawing Sheets

(56) References Cited

U.S. PATENT DOCUMENTS

| | | |
|---|---|---|
| 5,651,857 A | 7/1997 | Cronin et al. |
| 5,716,875 A | 2/1998 | Jones, Jr. et al. |
| 5,777,356 A | 7/1998 | Dhote et al. |
| 6,066,868 A | 5/2000 | Evans, Jr. |
| 6,115,281 A | 9/2000 | Aggarwal et al. |
| 6,117,688 A | 9/2000 | Evans, Jr. et al. |
| 6,194,754 B1 | 2/2001 | Aggarwal et al. |
| 6,211,035 B1 | 4/2001 | Moise et al. |
| 6,274,388 B1 | 8/2001 | Aggarwal et al. |
| 6,344,413 B1 | 2/2002 | Zurcher et al. |
| 6,346,741 B1 | 2/2002 | Buskirk et al. |
| 6,440,815 B1 | 8/2002 | Mitsuhashi |
| 6,587,367 B1 | 7/2003 | Nishimura et al. |
| 6,656,748 B2 | 12/2003 | Hall et al. |
| 6,713,342 B2 | 3/2004 | Celii et al. |
| 6,720,600 B2 | 4/2004 | Okita |
| 6,728,128 B2 | 4/2004 | Nishimura et al. |
| 7,029,925 B2 | 4/2006 | Celii et al. |
| 7,435,683 B2 | 10/2008 | Kavalieros et al. |
| 7,935,543 B2 | 5/2011 | Moise, IV et al. |
| 8,183,109 B2 | 5/2012 | Izumi et al. |
| 8,362,533 B2 | 1/2013 | Ozaki |
| 9,991,270 B2 | 6/2018 | Wang |
| 2003/0119211 A1 | 6/2003 | Summerfelt et al. |
| 2004/0135182 A1 | 7/2004 | An et al. |
| 2008/0038846 A1 | 2/2008 | Park et al. |
| 2008/0224194 A1 | 9/2008 | Sashida |
| 2009/0008743 A1 | 1/2009 | Lee et al. |
| 2009/0298201 A1 | 12/2009 | Nagai |
| 2010/0320518 A1 | 12/2010 | Ozaki |
| 2012/0107965 A1 | 5/2012 | Sashida |
| 2013/0264620 A1 | 10/2013 | Yu et al. |
| 2015/0072441 A1 | 3/2015 | Sun |
| 2016/0225423 A1 | 8/2016 | Naik et al. |
| 2017/0287920 A1 | 10/2017 | Wang |
| 2019/0027535 A1 | 1/2019 | Kumar et al. |
| 2019/0259807 A1 | 8/2019 | Kumar et al. |
| 2020/0105772 A1* | 4/2020 | Chen .................. H01L 28/60 |

FOREIGN PATENT DOCUMENTS

| | | |
|---|---|---|
| TW | 201241936 A | 10/2012 |
| TW | 201526206 A | 7/2015 |
| TW | 201715707 A | 5/2017 |
| TW | 201830585 A | 8/2018 |
| TW | 201830664 A | 8/2018 |
| TW | 201915624 A | 4/2019 |
| TW | 201917870 A | 5/2019 |
| TW | 201946052 A | 12/2019 |
| TW | 201946218 A | 12/2019 |
| WO | 2012078162 A1 | 6/2012 |

OTHER PUBLICATIONS

Non-Final Office Action dated Feb. 2, 2023 for U.S. Appl. No. 17/663,187.
Notice of Allowance dated Jan. 5, 2023 for U.S. Appl. No. 17/654,521.
Chandler, T. "An adaptive reference generation scheme for 1T1C FeRAMs", 2003 Symposium on VLSI Circuits. Digest of Technical Papers (IEEE Cat. No.03CH37408), Kyoto, Japan, 2003, pp. 173-174.
Final Office Action dated Mar. 9, 2022 for U.S. Appl. No. 16/795,404.
International Search Report & Written Opinion dated Apr. 15, 2021 for PCT Patent Application No. PCT/US2020/066950.
International Search Report & Written Opinion dated Apr. 21, 2021 for PCT Patent Application No. PCT/US2020/066955.
International Search Report & Written Opinion dated Apr. 22, 2021 for PCT Patent Application No. PCT/US2020/066958.
Jung, D. et al., "Highly manufacturable 1T1C 4 Mb FRAM with novel sensing scheme," International Electron Devices Meeting 1999. Technical Digest (Cat. No.99CH36318), Washington, DC, USA, 1999, pp. 279-282., International Electron Devices Meeting 1999. Technical Digest (Cat. No.99CH36318), Washington, DC, USA, 1999, pp. 279-282.
Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.
Non-Final Office Action dated Aug. 3, 2021 for Taiwanese Patent Application No. 109146059.
Non-Final Office Action dated Jan. 26, 2022 for U.S. Appl. No. 16/729,278.
Non-Final Office Action dated Jul. 8, 2021 for U.S. Appl. No. 16/729,267.
Non-Final Office Action dated Oct. 28, 2021 for U.S. Appl. No. 16/795,04.
Notice of Allowance dated Apr. 28, 2022 for Taiwan Patent Application No. 109146060.
Notice of Allowance dated Jan. 5, 2022 for U.S. Appl. No. 16/729,273.
Notice of Allowance dated Mar. 11, 2022 for U.S. Appl. No. 16/729,267.
Office Action dated Nov. 2, 2021 for Taiwan Patent Application No. 109146058.
Office Action dated Sep. 6, 2021 for Taiwan Patent Application No. 109146060.
Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.
Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.
Restriction Requirement dated Mar. 26, 2021 for U.S. Appl. No. 16/729,267.
Restriction Requirement dated Nov. 9, 2021 for U.S. Appl. No. 16/729,278.
Second Office Action dated Apr. 11, 2022 for TW Patent Application No. 109146059.
Second Office Action dated Feb. 21, 2022 for Taiwan Patent Application No. 109146058.
Second Office Action dated Mar. 10, 2022 for Taiwan Patent Application No. 109146059.
Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.
Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.
Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.
Advisory Action dated May 20, 2022 for U.S. Appl. No. 17/795,404.
International Preliminary Report on Patentability dated Jul. 7, 2022 for PCT Patent Application No. PCT/2020/066958.
International Preliminary Report on Patentability dated Jul. 7, 2022 for PCT Patent Application No. PCT/US2020/066950.
International Preliminary Report on Patentability dated Jul. 7, 2022 for PCT Patent Application No. PCT/US2020/066955.
Non Final Office Action dated Jun. 8, 2022 for U.S. Appl. No. 16/729,267.
Non-Final Office Action dated Aug. 18, 2022 for U.S. Appl. No. 16/795,404.
Notice of Allowance (2) dated Jun. 27, 2022 for U.S. Appl. No. 16/729,267.
Notice of Allowance dated Aug. 29, 2022 for Taiwan Patent Application No. 109146059.
Notice of Allowance dated Jun. 9, 2022 for U.S. Appl. No. 16/729,278.
Notice of Allowance dated May 24, 2022 for Taiwan Patent Application No. 109146058.
Notice of Allowance dated Oct. 3, 2022 for U.S. Appl. No. 16/795,404.

* cited by examiner

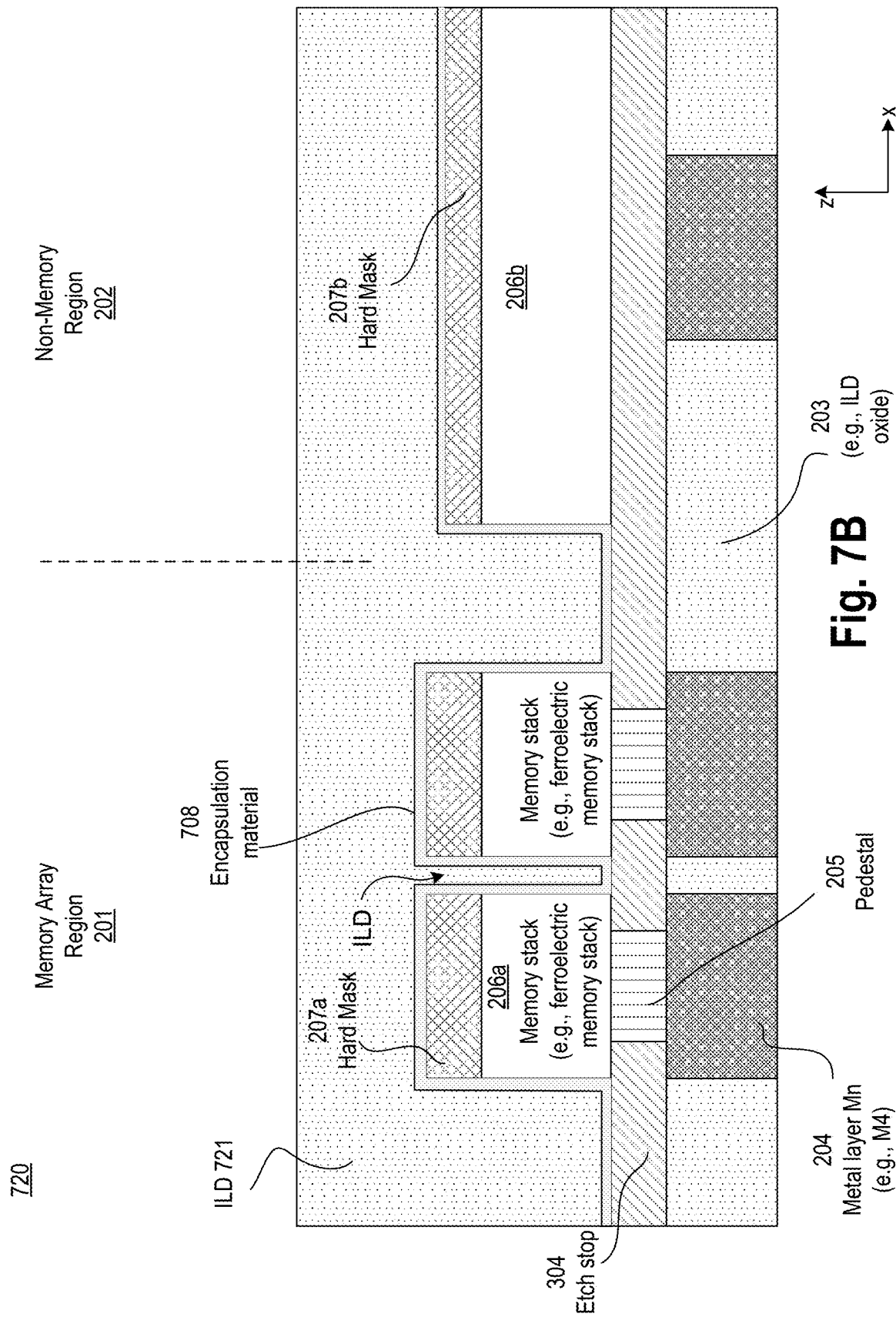

EMBEDDED MEMORY WITH ENCAPSULATION LAYER ADJACENT TO A MEMORY STACK

This application is a continuation of, and claims the benefit of priority to U.S. patent application Ser. No. 17/345,964, filed on Jun. 11, 2021, titled "Process Integration flow for Embedded Memory Enabled by Decoupling Processing of a Memory Area from a Non-Memory Area", and which is incorporated by reference in entirety.

BACKGROUND

Embedded memory is an integrated on-chip memory that supports other on-chip logic circuitries. The embedded memory resides in a memory area having memory material (e.g., metal-insulation-metal capacitors) while the logic resides in a non-memory area having non-memory material (e.g., typical complementary metal oxide semiconductor (CMOS) material). In a fabrication process for embedded memories, an etch rate is higher in the non-memory area where pattern density is lower compared to pattern density in the memory area. This higher etch rate poses a risk of exposing underlying metal to an etch chamber. To compensate for this higher etch rate, thicker etch stop layers are used in the fabrication process, which increases height of memory devices in the memory area. Taller memory devices mean taller dies, which makes downstream process integration very challenging. Encapsulation process is a fabricating process where the memory area (and/or non-memory area) is protected during etching. Using non-conventional etch stop material for encapsulation is not permitted in a conventional fabrication flow because such non-conventional etch stop material for encapsulation results in modification of via fabrication processes, and thus a disruption (resulting in higher cost) to the overall fabrication process of the embedded memory.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 3-6, 7A-7B, 8-10, and 11A-11C illustrate cross-sections of a die portion having a memory area and a non-memory area, where the cross-sections use a pocket mask to decouple etching process of the memory array and the non-memory area, in accordance with some embodiments.

DETAILED DESCRIPTION

Figure 1:
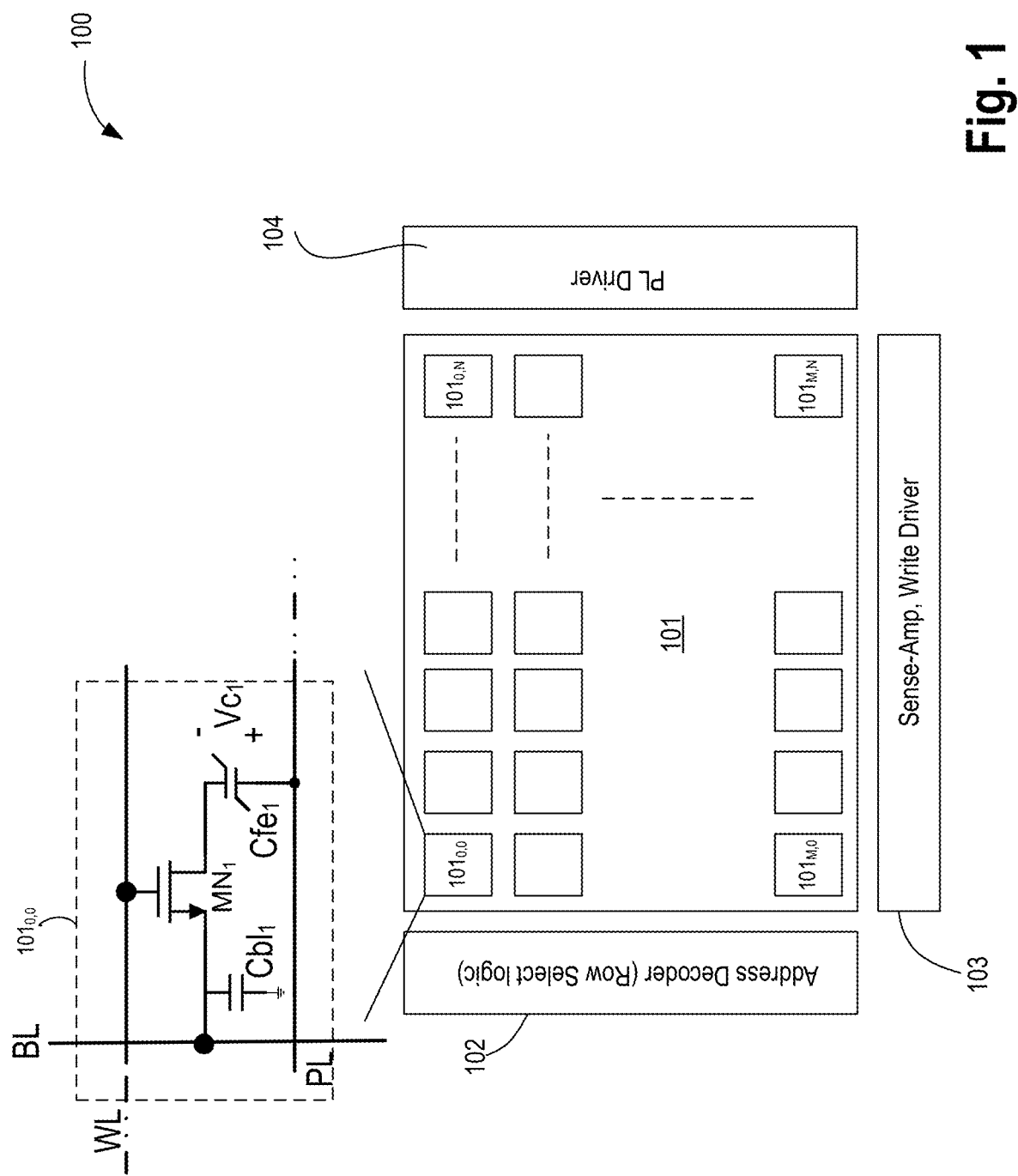
FIG. 1 illustrates an apparatus comprising memory and corresponding logic, wherein the memory comprises ferroelectric (FE) memory bit-cells formed using a pocket and/or a multi-pocket mask flow, in accordance with some embodiments.

Various embodiments describe an integration and patterning flow that is used to pattern a memory array area for an embedded memory without perturbing a fabricating process for logic circuitries. Some embodiments describe fabrication processes using a pocket mask (e.g., a hard mask, which is also referred to as a decoupling mask) to decouple the etching process of a memory array area and non-memory area. Such decoupling allows for a simpler fabrication process with little to no impact on the current fabrication process. Some embodiments describe a fabrication process using multiple pocket masks (or decoupling masks) to decouple the etching process of the memory array area and the non-memory area. This fabrication process (using multiple pocket masks) avoids exposure of memory material into a second pocket etch chamber. In some embodiments, the process of etching memory material is decoupled from the process of etching an encapsulation material.

In some embodiments, the embedded memory is a dynamic random-access memory (DRAM). In some embodiments, the embedded memory is a ferroelectric random-access memory (FeRAM). FeRAM includes bit-cells having at least one transistor and one ferroelectric capacitor having ferroelectric material. Ferroelectric material exhibits ferroelectricity. Ferroelectricity is a phenomenon observed in certain types of crystals, the origin of the phenomenon is related to the lack of a center of symmetry within the crystal unit cell, which results in a permanent dipole moment. Specifically, in ferroelectrics, the direction of this dipole moment can be reversed by the application of electric fields. Thus, the performance of a ferroelectric device depends closely on the orientation of the crystal lattice of the ferroelectric. The ferroelectric capacitor in the memory area can be a planar capacitor of a pillar capacitor.

In some embodiments, a method for fabricating an embedded memory is provided, where the method comprises removing a memory material from a non-memory area of a die, wherein the memory material is adjacent to an etch stop layer. The method further comprises removing a hard mask material over the non-memory area. In some embodiments, the method comprises etching an encapsulation layer of the non-memory area, while maintaining the encapsulation layer adjacent to a memory material in a memory area of the die. In some embodiments, the method comprises applying a pocket mask over the encapsulation layer of the memory area to enable a process of etching of the encapsulation layer from the non-memory area, wherein the encapsulation layer remains adjacent to the hard mask material, wherein the hard mask material is over the memory material of the memory area. In some embodiments, the method comprises etching of the encapsulation layer to form a via over the hard mask material, wherein the hard mask material is over the memory material.

In some embodiments, the method comprises depositing an etch stop layer over a metal layer, wherein the etch stop layer is deposited over the non-memory area and the memory area. In some embodiments, the method comprises etching a portion of the etch stop layer to access the metal layer within the memory area of the die. In some embodiments, the method comprises forming a pedestal over the metal layer by depositing metal into the etched portion of the etch stop layer. In some embodiments, the method comprises polishing a surface of the pedestal down to a top surface of the etch stop layer. In some embodiments, the method comprises depositing the memory material over the pedestal and the etch stop layer. In some embodiments, the method comprises depositing the hard mask material over the memory material. In some embodiments, the method comprises applying pillar etch and hard mask patterning on the hard mask material, wherein an etch rate is higher in the non-memory area than in the memory area during the hard mask patterning and/or applying pillar etch. In some embodiments, the method comprises applying pillar etch on the memory material down to a top surface of the etch stop layer. In some embodiments, the method comprises conformally depositing the encapsulation layer such that the encapsulation layer is adjacent to the hard mask material, the memory material, and the top surface of the etch stop layer.

In some embodiments, the method comprises depositing interlayer dielectric over the encapsulation layer and part of the etch stop layer. In some embodiments, the method comprises polishing the interlayer dielectric to planarize the interlayer dielectric in the non-memory area and the non-memory area. In some embodiments, the method comprises etching the polished interlayer dielectric and a portion of the etch stop layer. In some embodiments, the memory material comprises a capacitor. In some embodiments, the memory material is part of dynamic random-access memory. In some embodiments, the capacitor comprises non-linear polar material which includes one of: ferroelectric material, paraelectric material, or non-linear dielectric.

There are many technical effects of various embodiments. For example, the fabrication flow eliminates the use of thicker etch stop layers to compensate for higher etch rate in the non-memory area compared to the memory area. The fabrication process also allows use of existing fabrication processes by introducing a pocket mask to decouple the etching process of memory array and non-memory area. The fabrication process is further simplified using 2-pocket masks to avoid exposure of memory material into a second pocket etch chamber. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material or silicon semiconductor material layers (e.g., Indium gallium zinc oxide (IGZO), or doped IGZO) may be stacked within a single fin structure, multiple fins, nano-sheet, nanowire configuration, and/or planar transistors. The multiple non-silicon semiconductor material layers or silicon semiconductor material layers may include one or more "P-type" layers that are suitable (e.g., offer higher hole mobility than silicon) for P-type transistors. The multiple non-silicon semiconductor material layers or silicon semiconductor material layers may further include one or more "N-type" layers that are suitable (e.g., offer higher electron mobility than silicon) for N-type transistors. The multiple non-silicon semiconductor material layers or silicon semiconductor material layers may further include one or more intervening layers separating the N-type from the P-type layers. The intervening layers may be at least partially sacrificial, for example to allow one or more of a gate, a source, or a drain to wrap completely around a channel region of one or more of the N-type and P-type transistors. The multiple non-silicon semiconductor material layers or silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates apparatus 100 comprising memory and corresponding logic, wherein the memory comprises ferroelectric (FE) memory bit-cells formed using the pocket and/or the 2-pocket mask flow, in accordance with some embodiments. Logic 102 comprises address decoders for selecting a row of bit-cells and/or a particular bit-cell from M×N array 101, where M and N are integers of same or different values. Logic 103 comprises sense-amplifiers for reading the values from the selected bit-cell, while write drivers are used to write a particular value to a selected differential bit-cell. Logic 103 also includes plate-line (PL) drivers to drive the PL of the bit-cells. Here, a schematic of ferroelectric (FE) bit-cell $101_{0,0}$ is illustrated. The same embodiments apply to other bit-cells of M×N array 101. In some embodiments, each bit-cell can be a differential bit-cell.

In some embodiments, ferroelectric bit-cell $101_{0,0}$ comprises a word-line (WL), a plate-line (PL), a bit-line (BL), an n-type transistor $MN_1$, and an FE capacitive structure $Cfe_1$. In some embodiments, the gate of transistor $MN_1$ is coupled to the WL. In some embodiments, a first terminal of the FE capacitive structure $Cfe_1$ is coupled to the PL while a second terminal of the FE capacitive structure $Cfe_1$ is coupled to source or drain terminals of the n-type transistor $MN_1$. In some embodiments, the BL is coupled to the source or drain terminal of the transistor $MN_1$. In some embodiments, a BL capacitor $Cbl_1$ (a non-ferroelectric capacitor) is coupled to the source or drain terminal of the transistor $MN_1$ and to a reference node (e.g., ground) such that FE capacitor $Cfe_1$ is not coupled to the same source or drain terminal.

Figure 20:
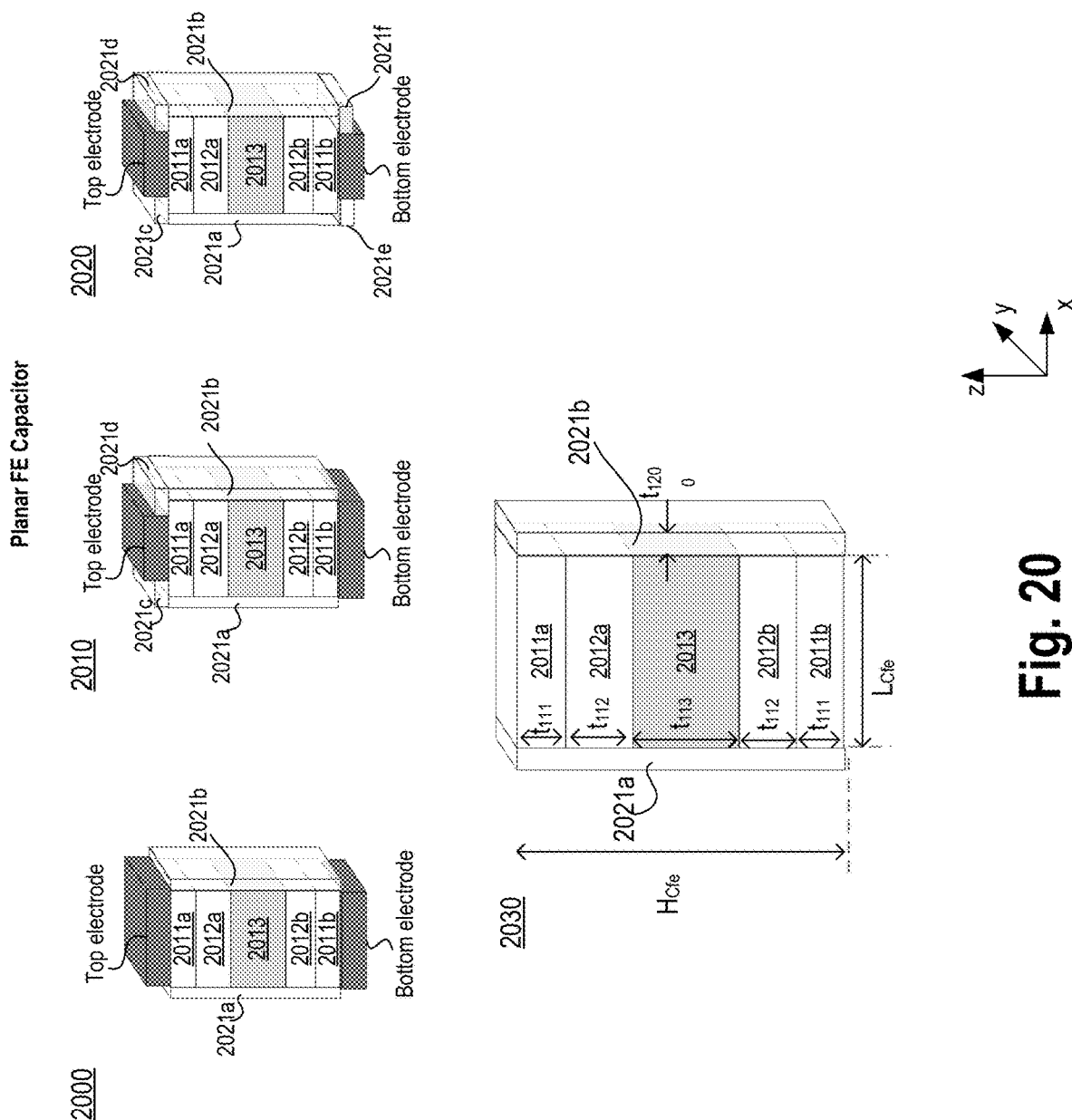
FIG. 20 illustrates various kinds of planar ferroelectric capacitors for use in the memory area, in accordance with some embodiments.
Figure 21:
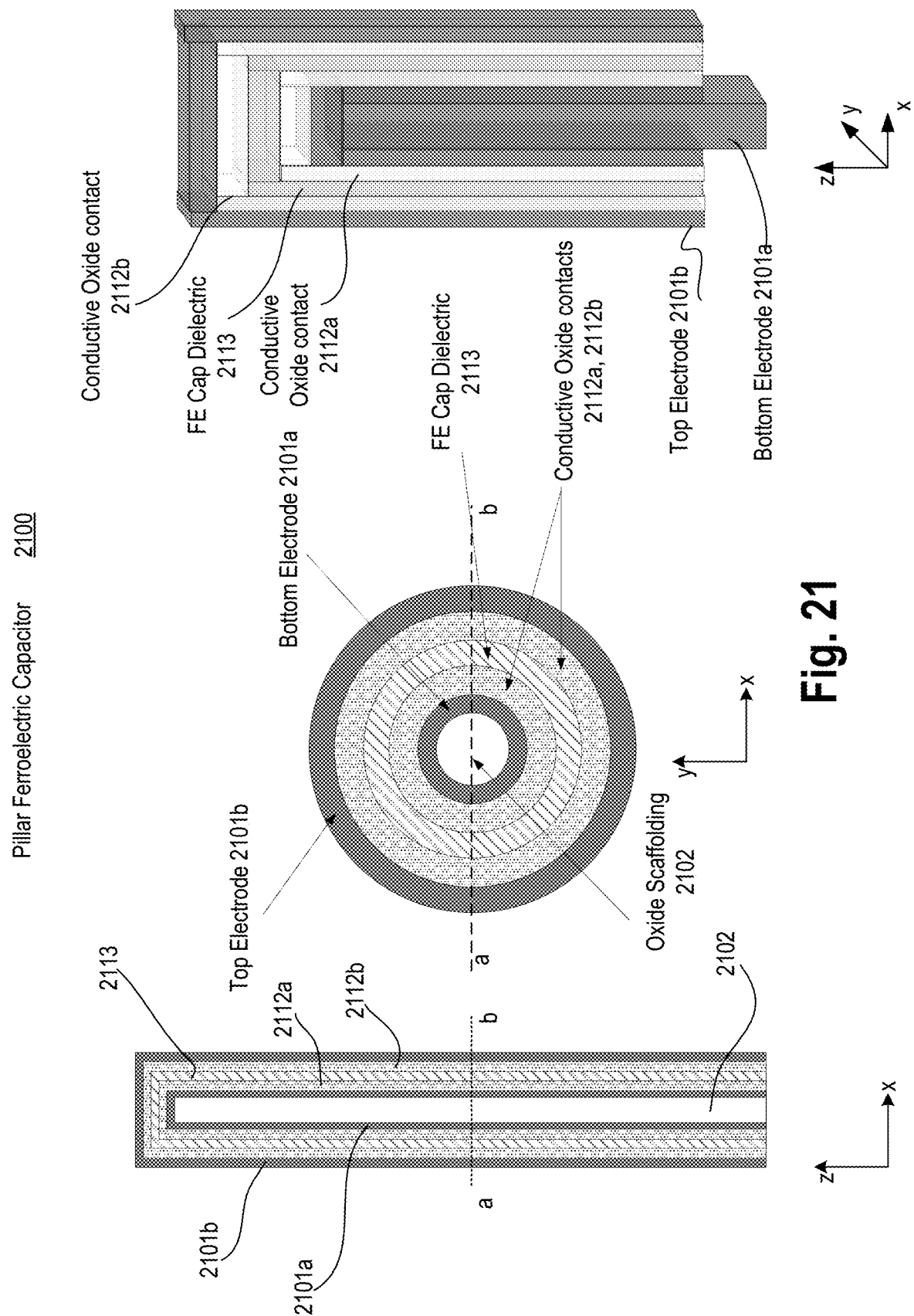
FIG. 21 illustrates a pillar ferroelectric capacitor for use in the memory area, in accordance with some embodiments.

In some embodiments, the FE capacitor $Cfe_1$ comprises a stack of layers. FIGS. 20-21 illustrate various stack configurations. In some embodiments, the stack of layers includes a templating or texturing material. The templating or texturing material can be a single layer deposited below a ferroelectric layer to enable a crystal lattice of the subsequently deposited ferroelectric layer to template off this templating material and provide a large degree of preferential orientation despite the lack of epitaxial substrates. In some embodiments, the templating material is part of a bottom electrode. In some embodiments, the templating material is part of a bottom electrode and a barrier layer. The memory array area of various embodiments can comprise differential bit-cells. In some embodiments, the memory area of the embedded memory comprises DRAM, which includes bit-cells also organized in rows and columns. Each DRAM bit-cell includes an access transistor and a non-ferroelectric capacitor. While the various embodiments are illustrated for ferroelectric memory stacks, the fabrication process of various embodiments is applicable to any embedded memory. For example, the memory stack can comprise a magnetic memory stack (MRAM), a resistive memory stack (ReRam), etc.

Figure 2:
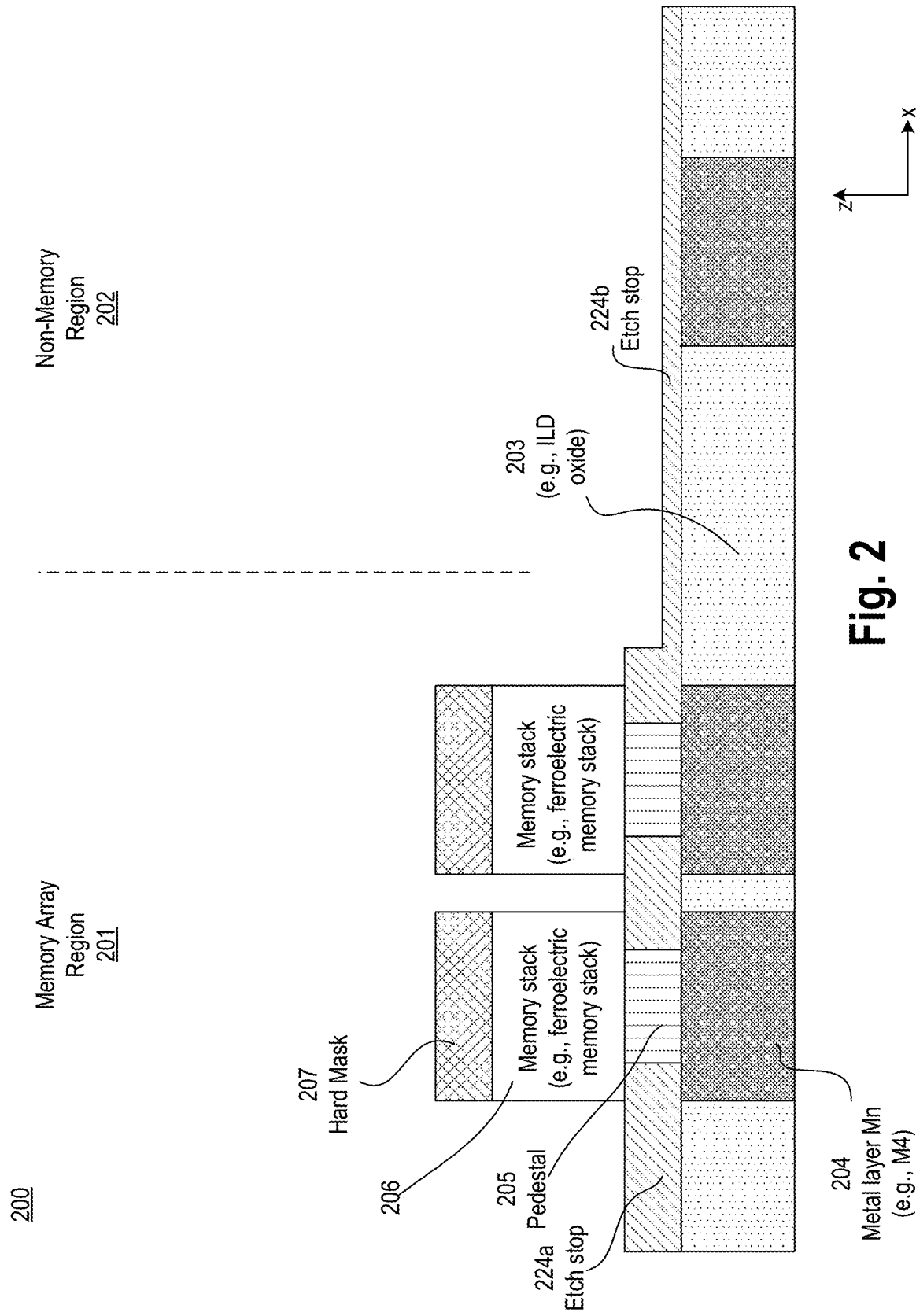
FIG. 2 illustrates a cross-section of a die portion having a memory area and a non-memory area, where the etch stop layer in the non-memory area is etched more than the etch stop layer of the memory area.
Figure 3:
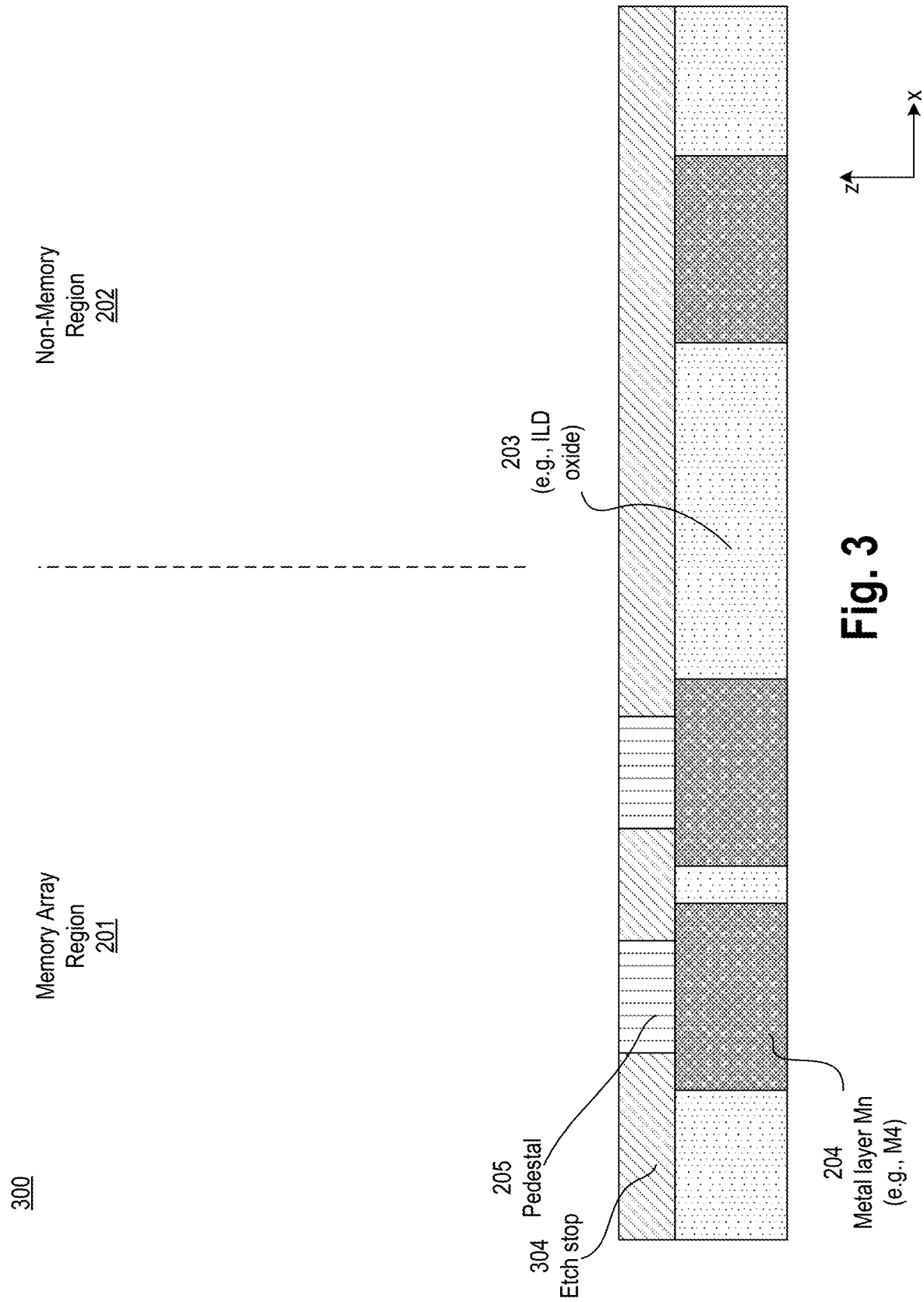
Figure 4:
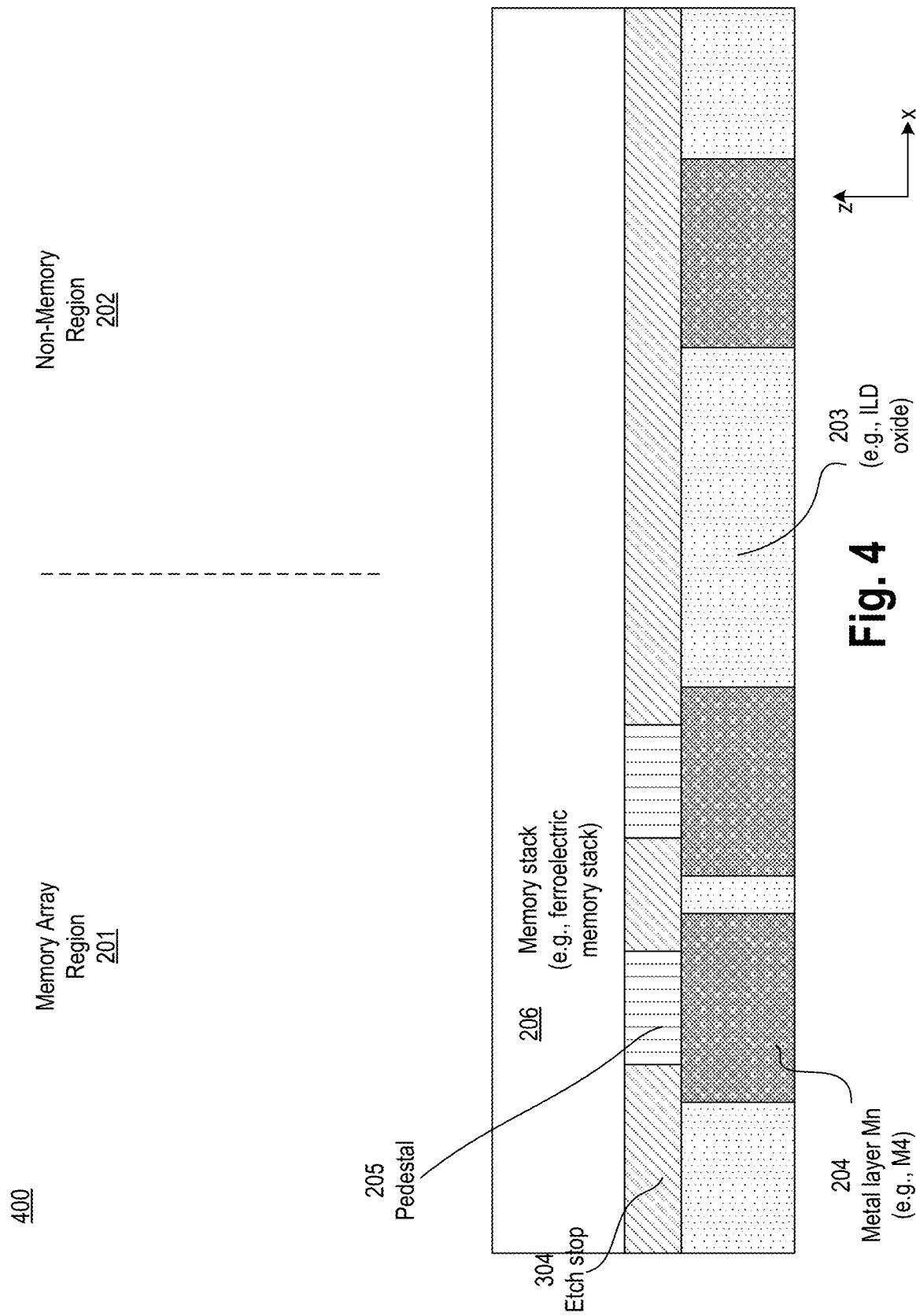
Figure 5:
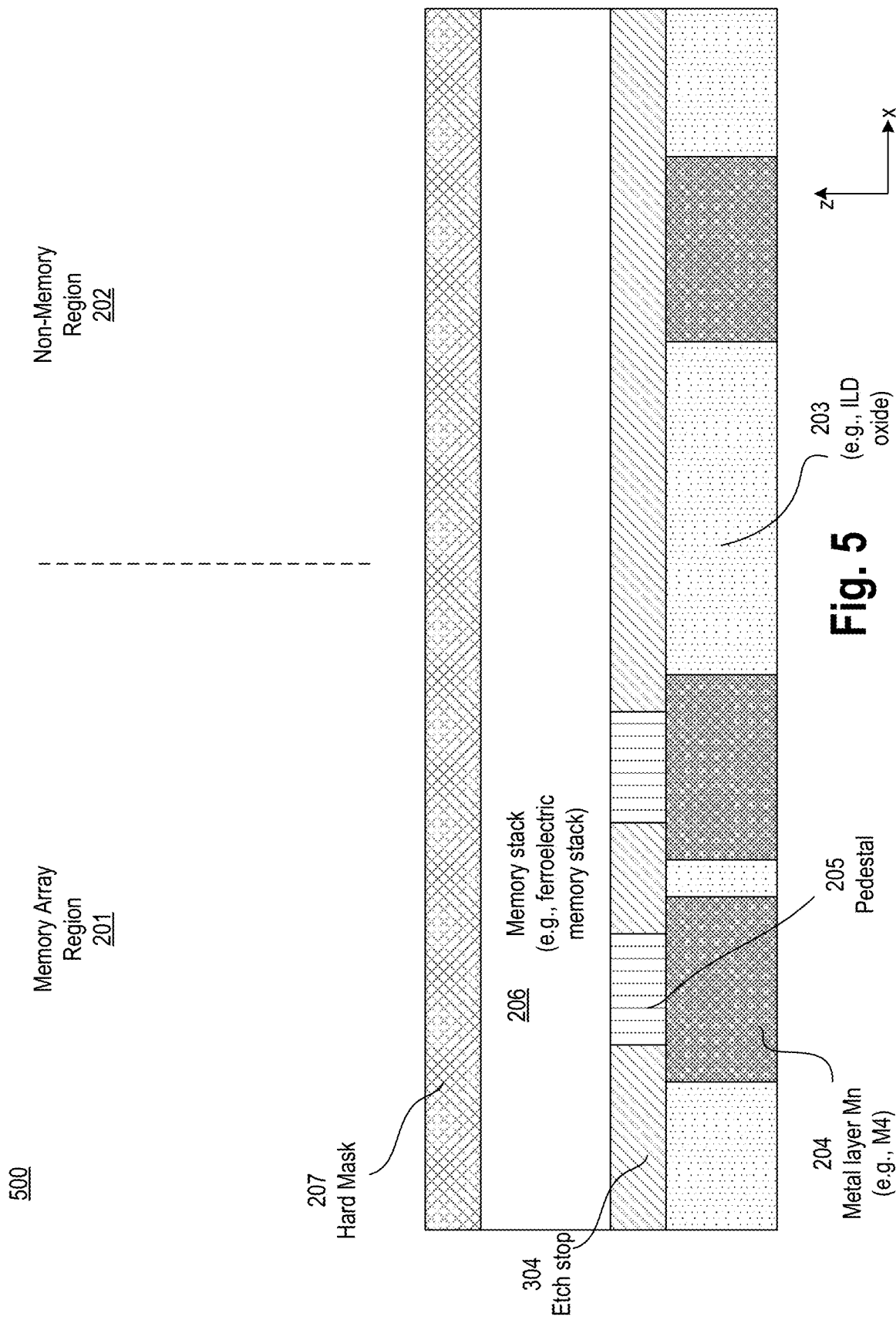
Figure 6:
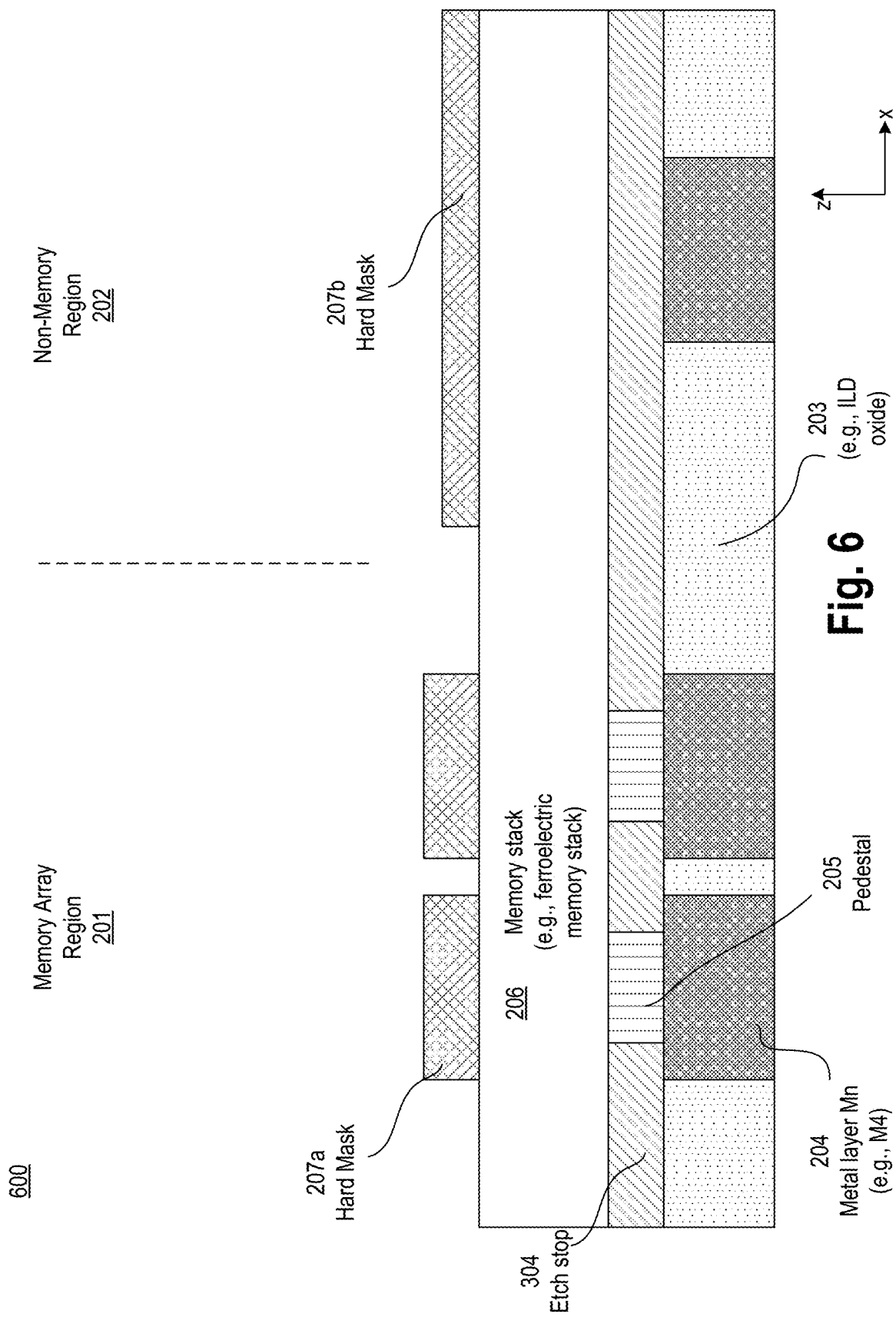
Figure 7A:
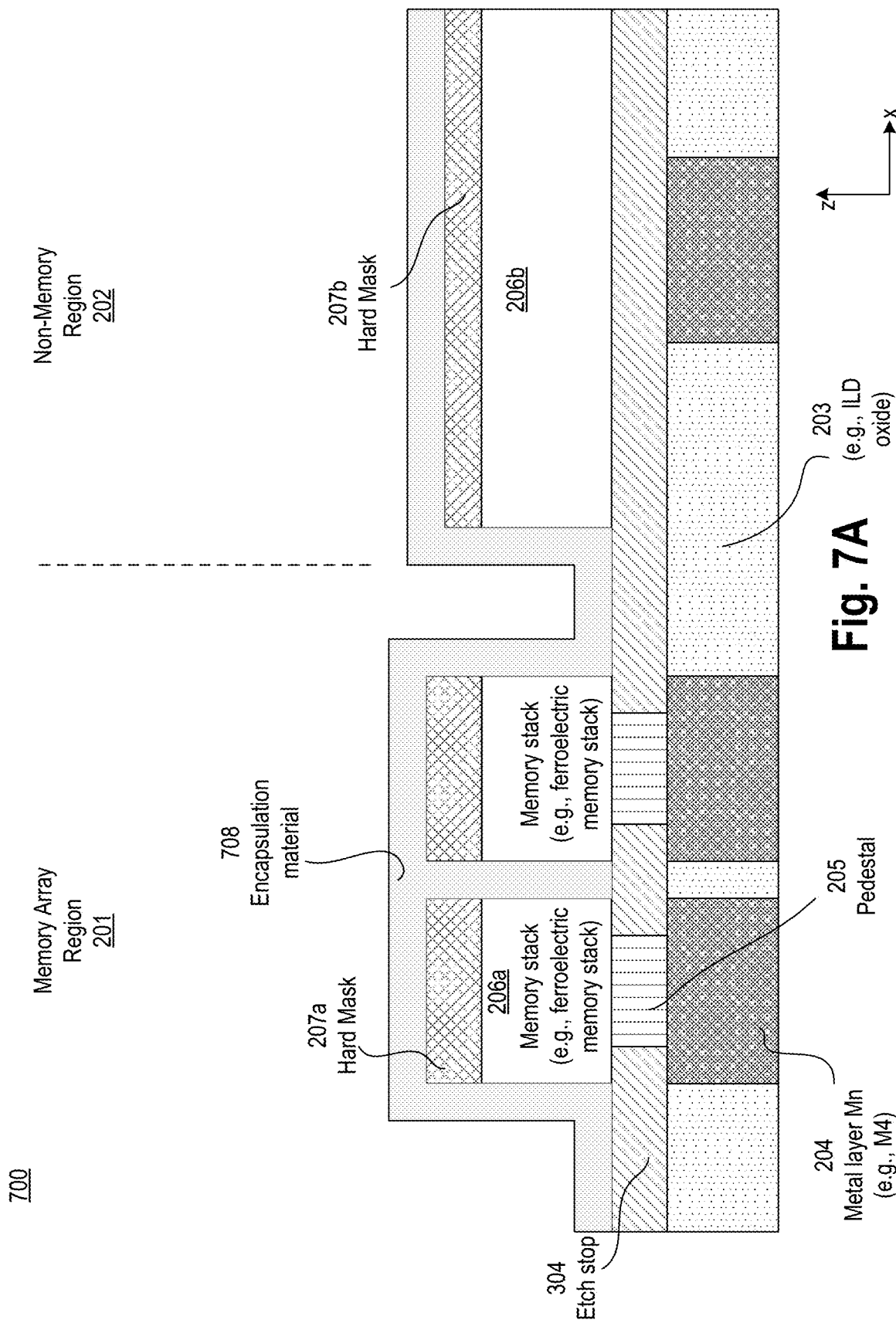
Figure 8:
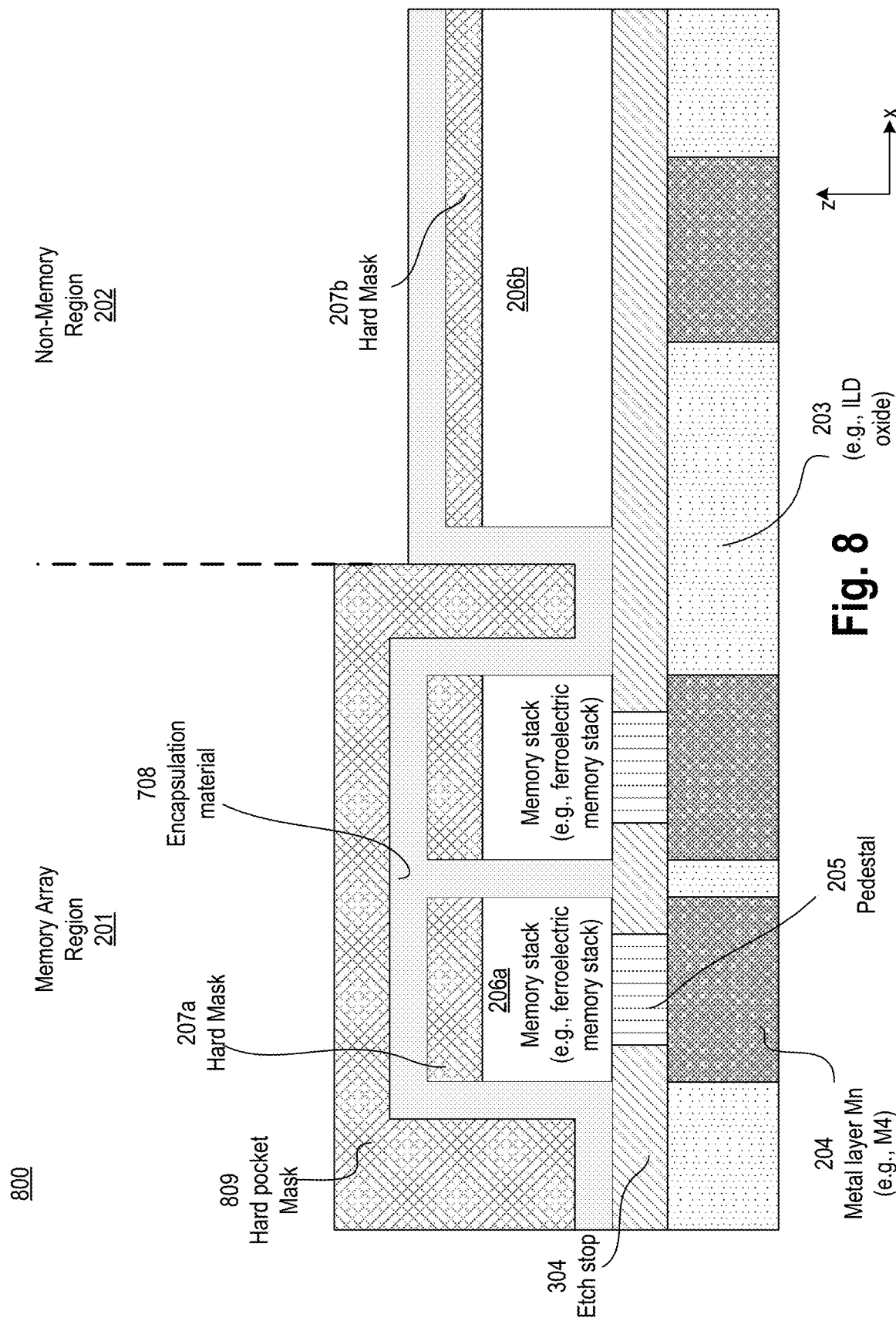
Figure 9:
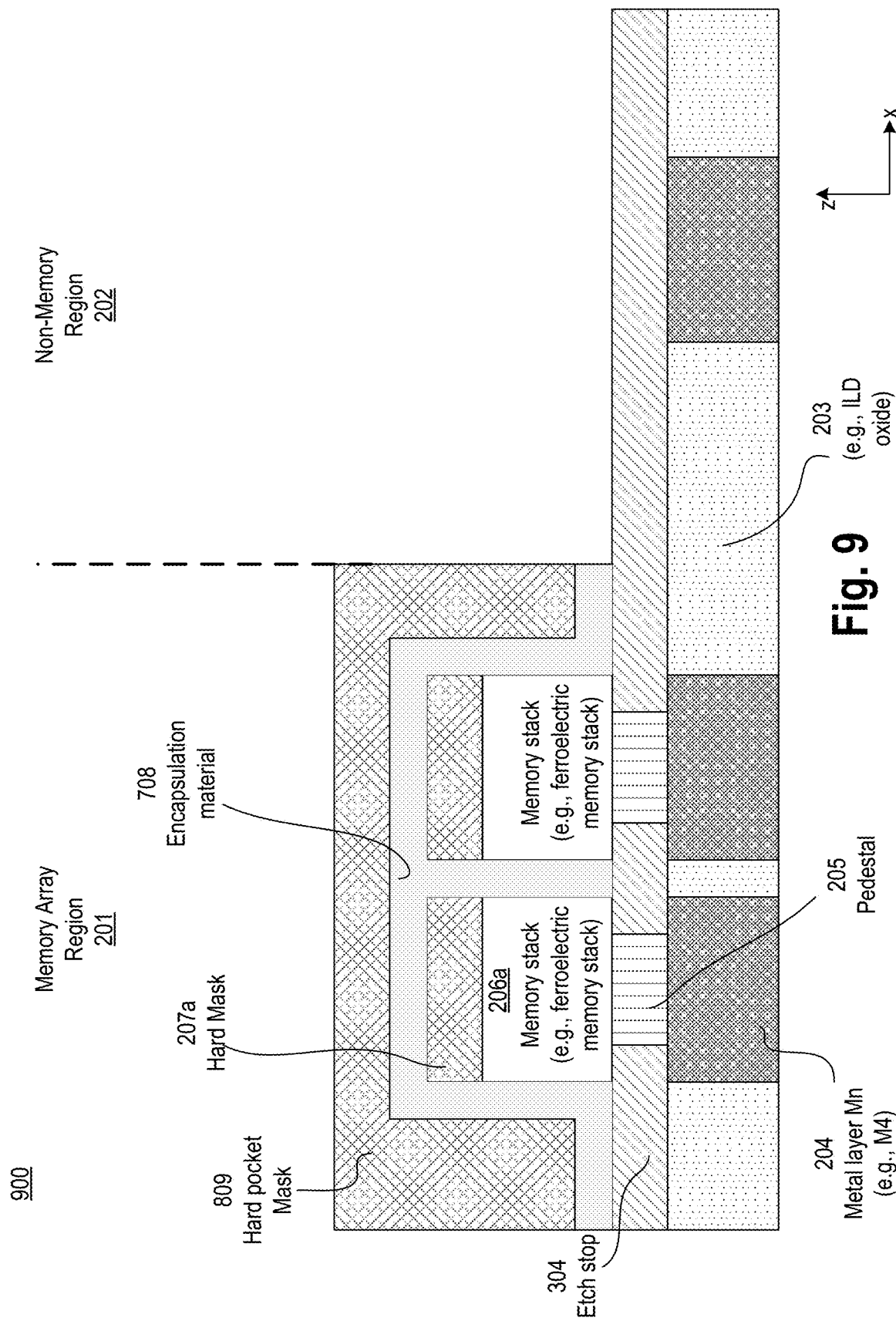
Figure 10:
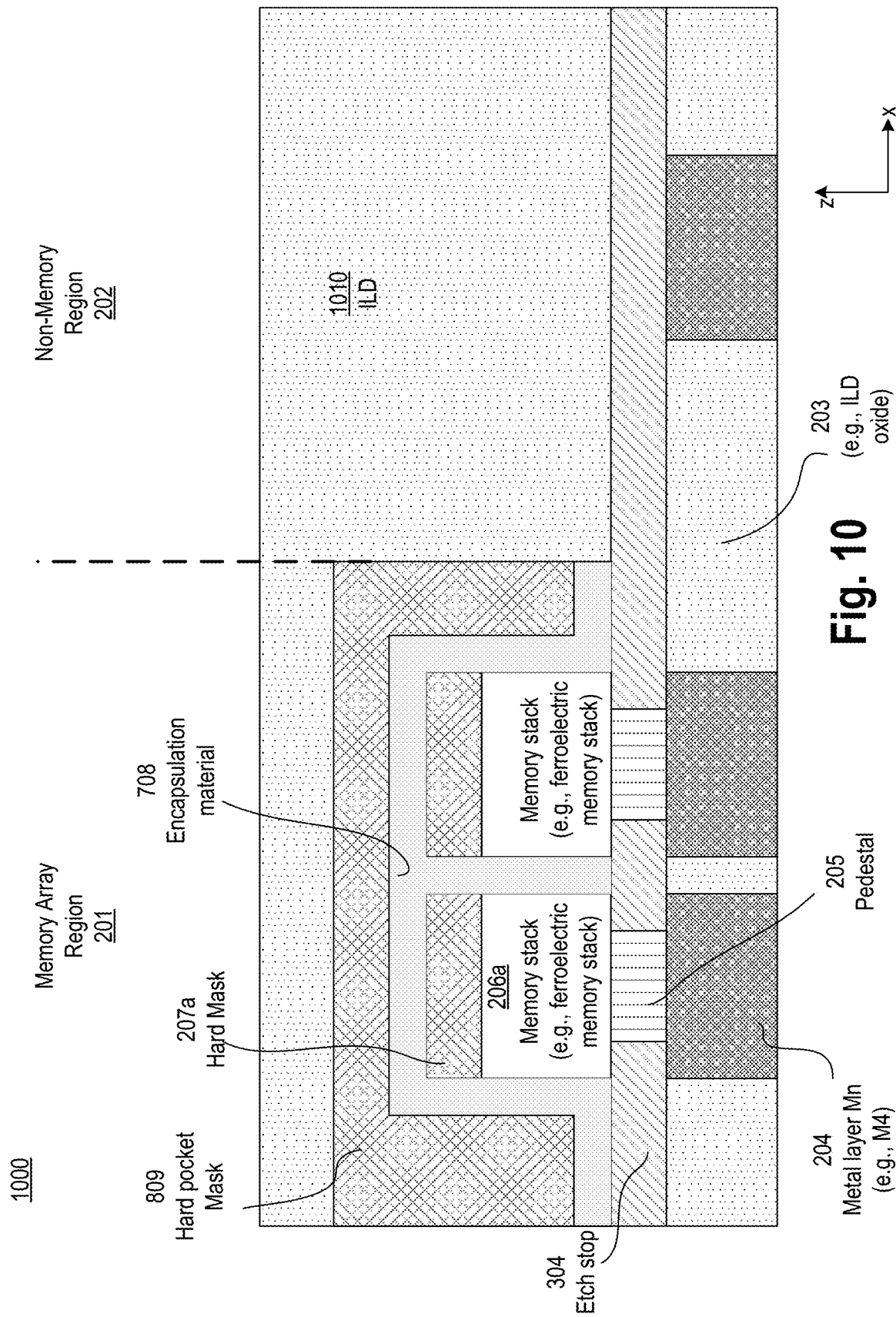
Figure 11A:
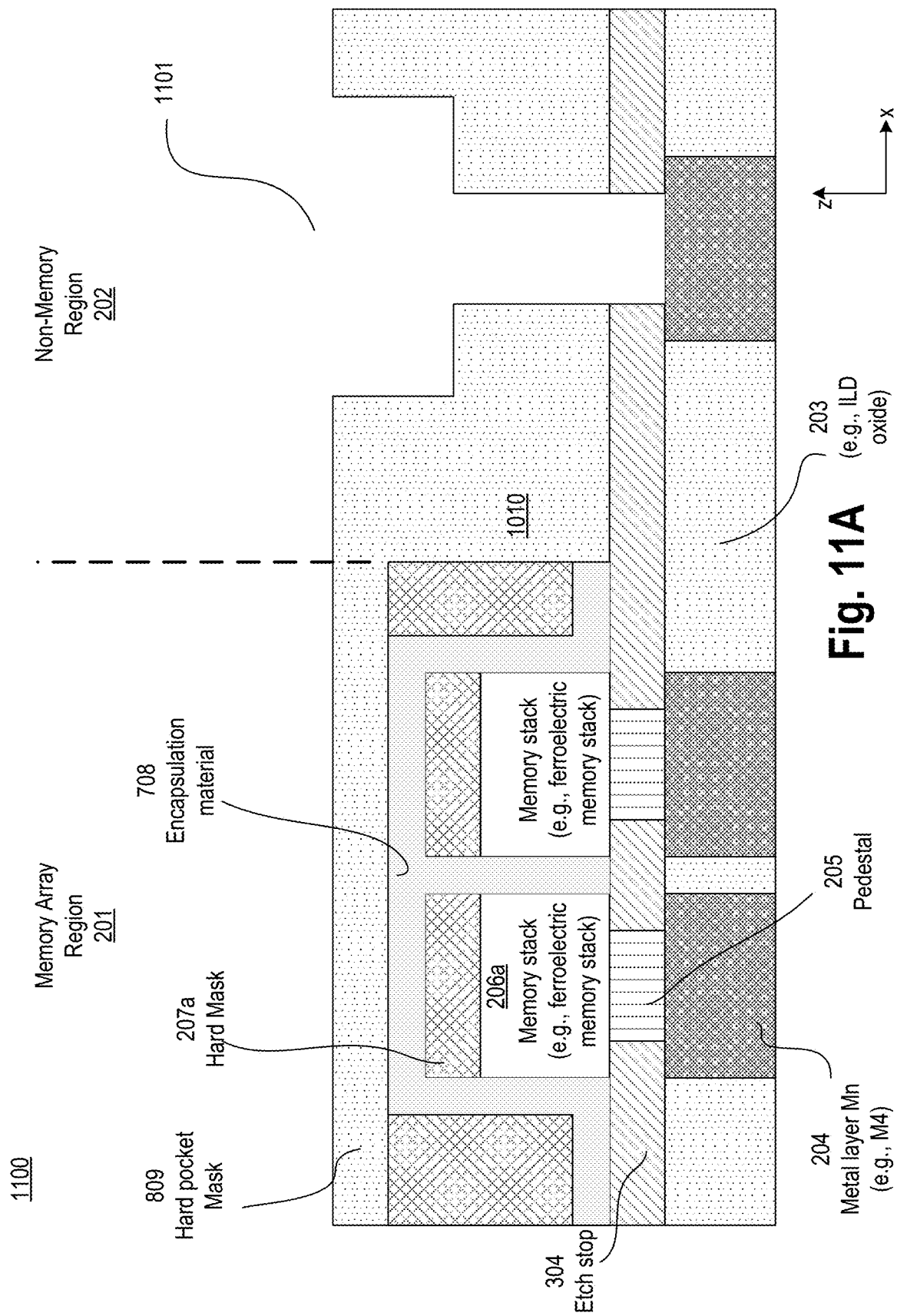
Figure 11B:
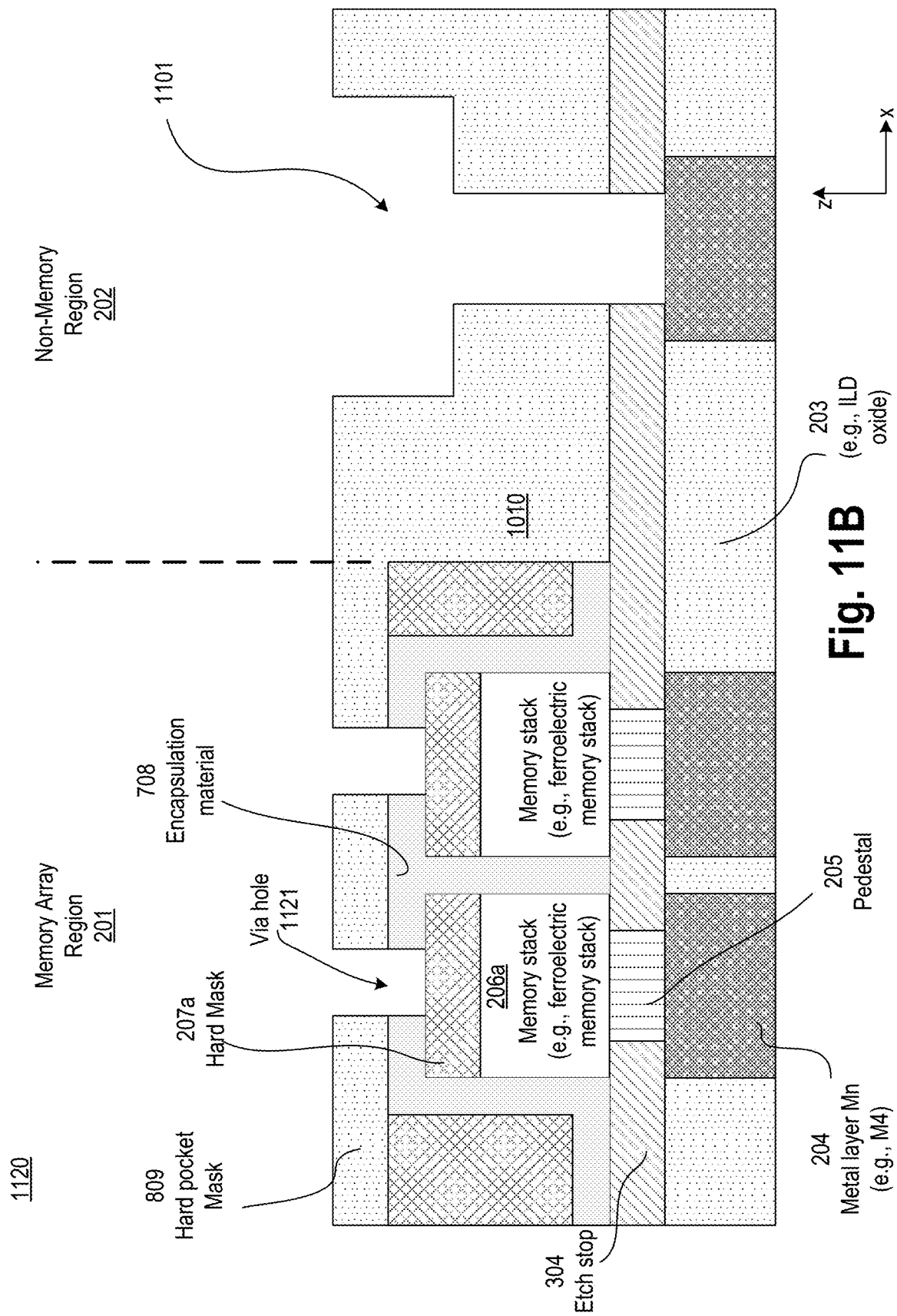
Figure 11C:
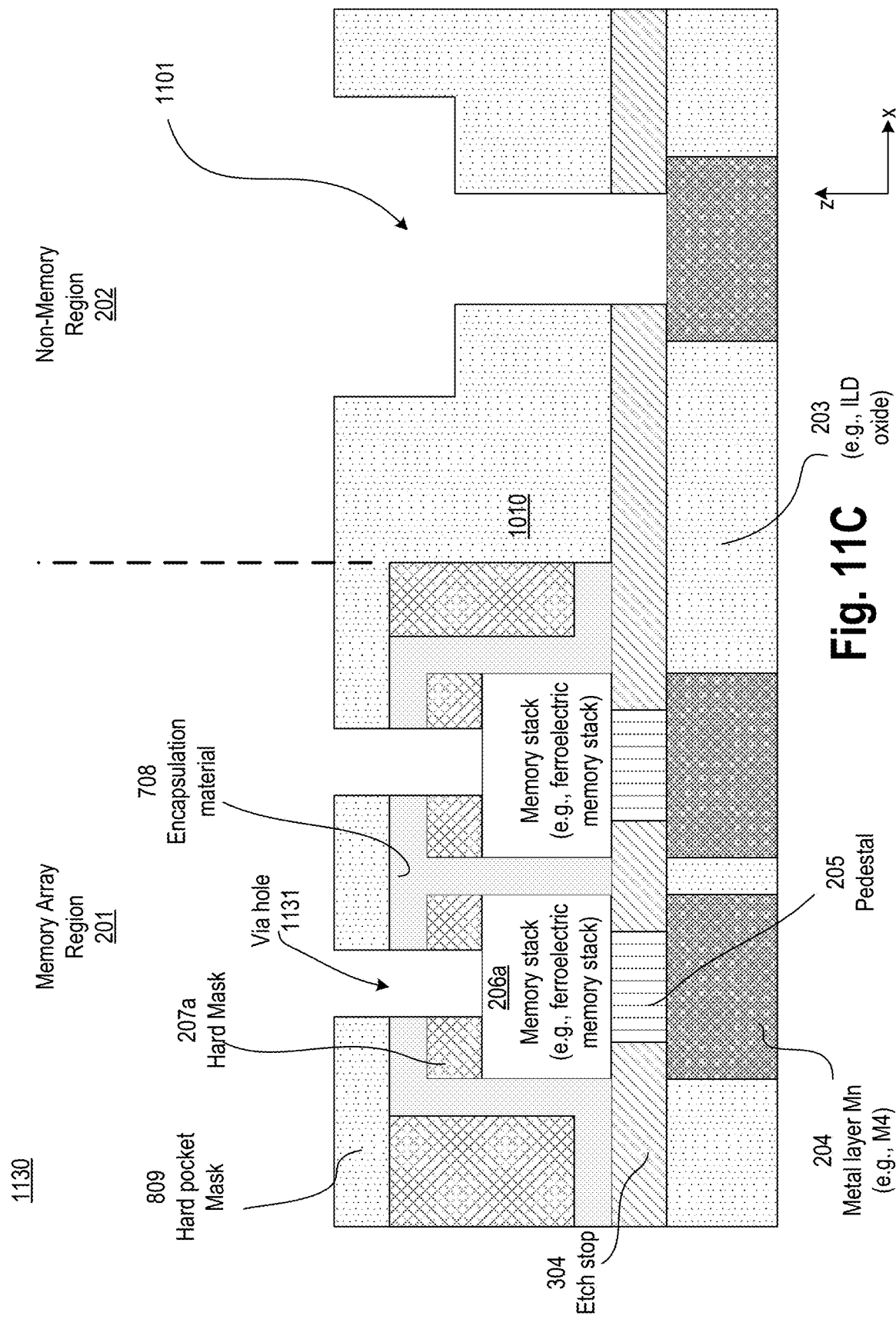
Figure 12:
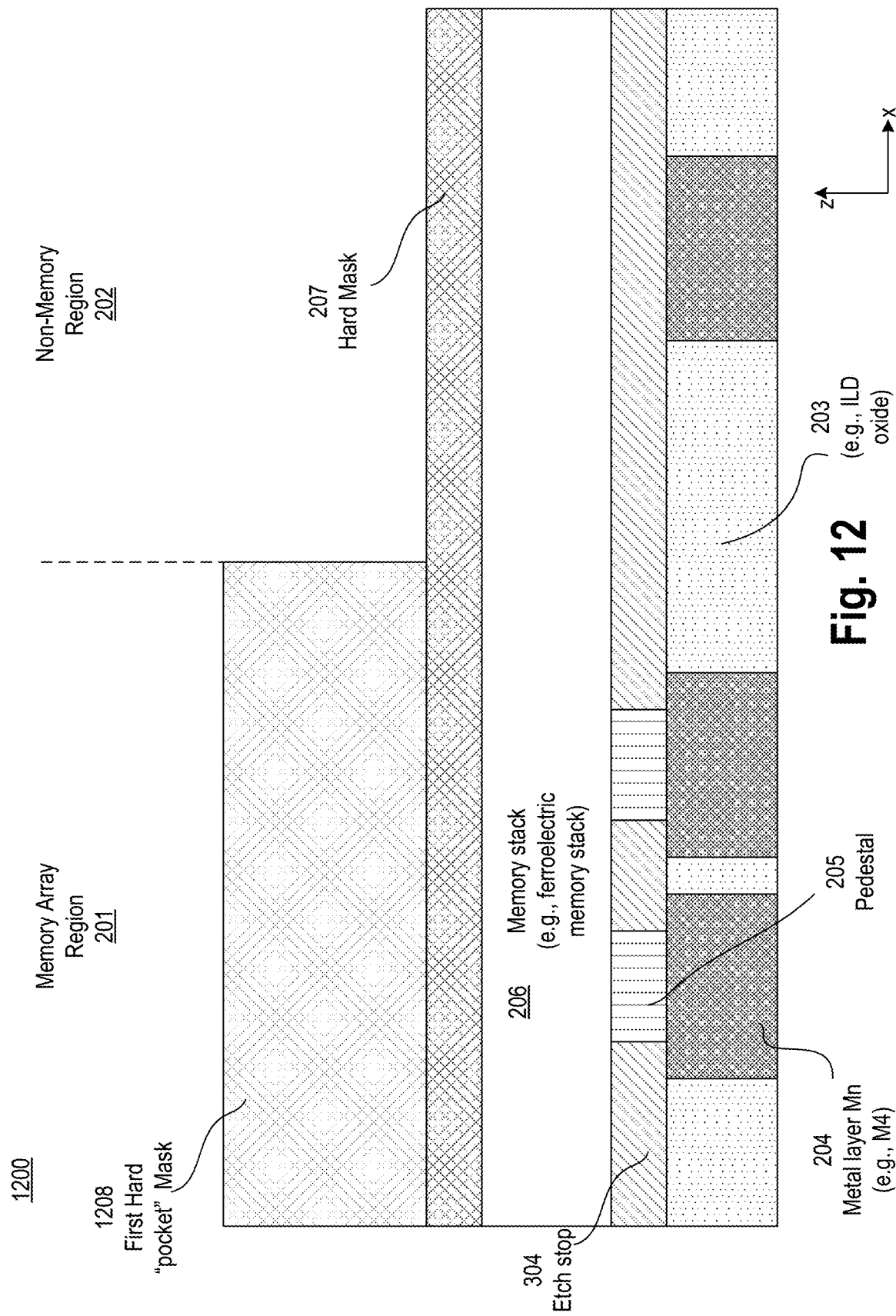
FIGS. 12-18, and 19A-19C illustrate cross-sections of a die portion having a memory area and a non-memory area, where the cross-sections use multiple pocket masks to decouple etching process of the memory array and the non-memory area, in accordance with some embodiments.
Figure 13:
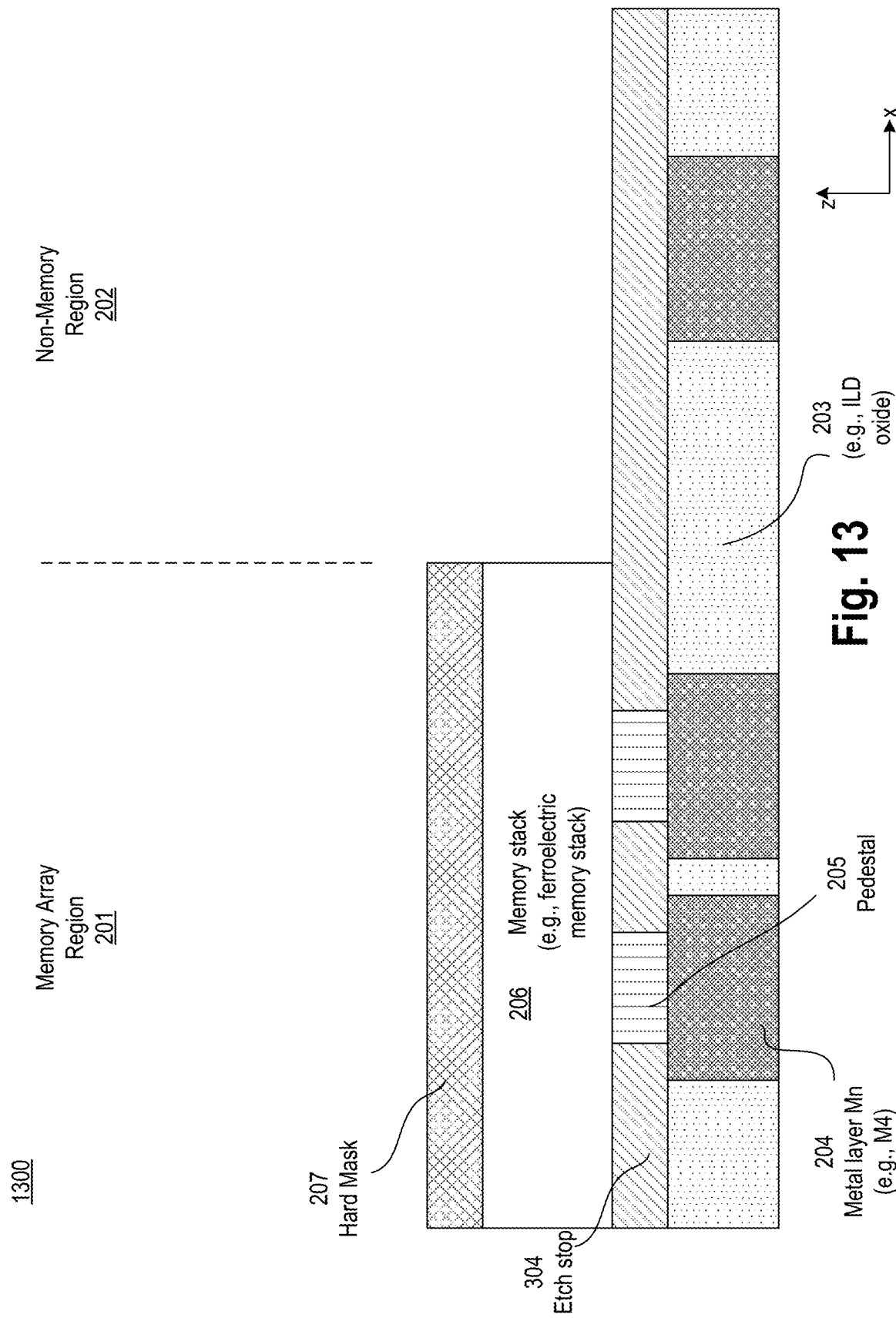
Figure 14:
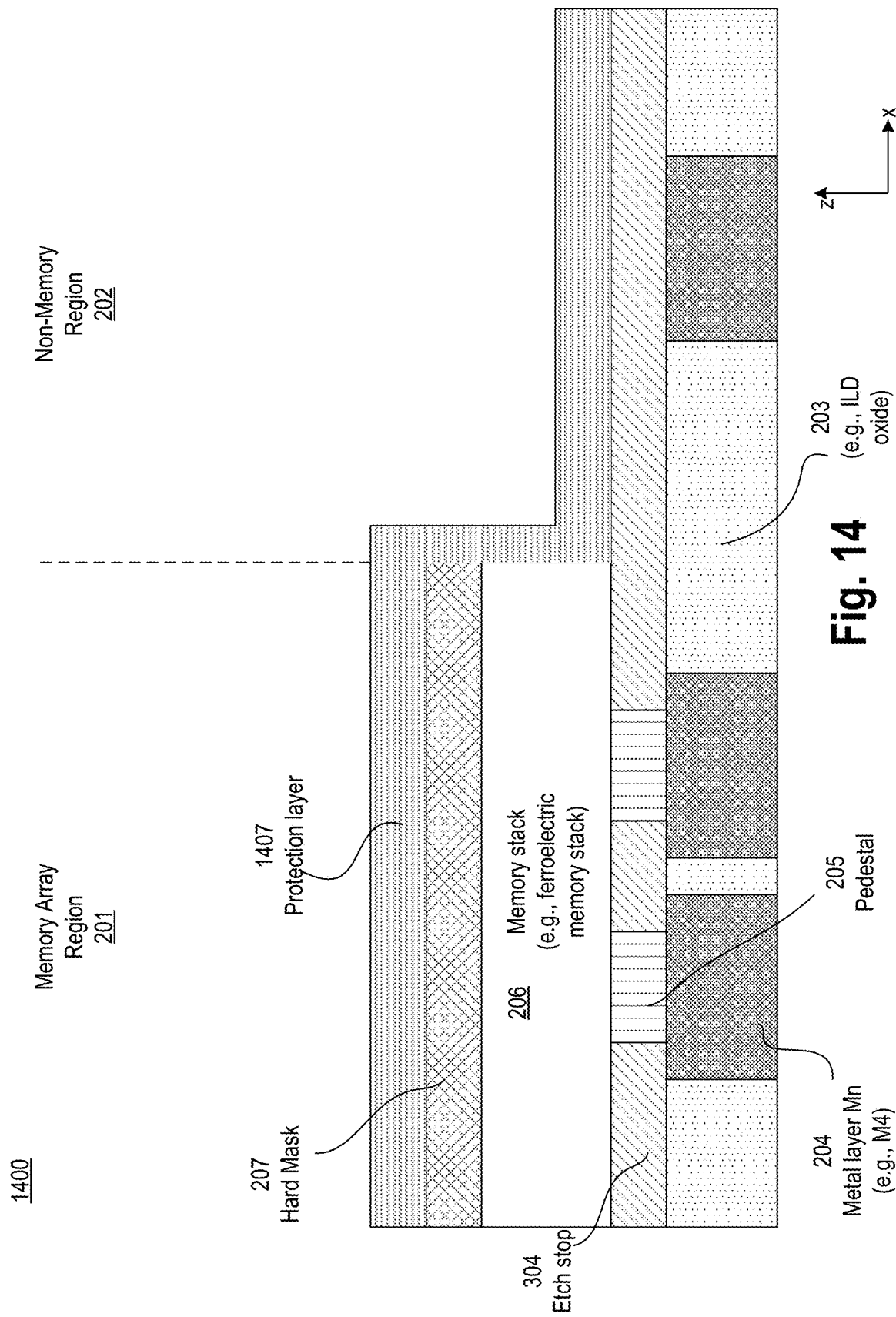
Figure 15:
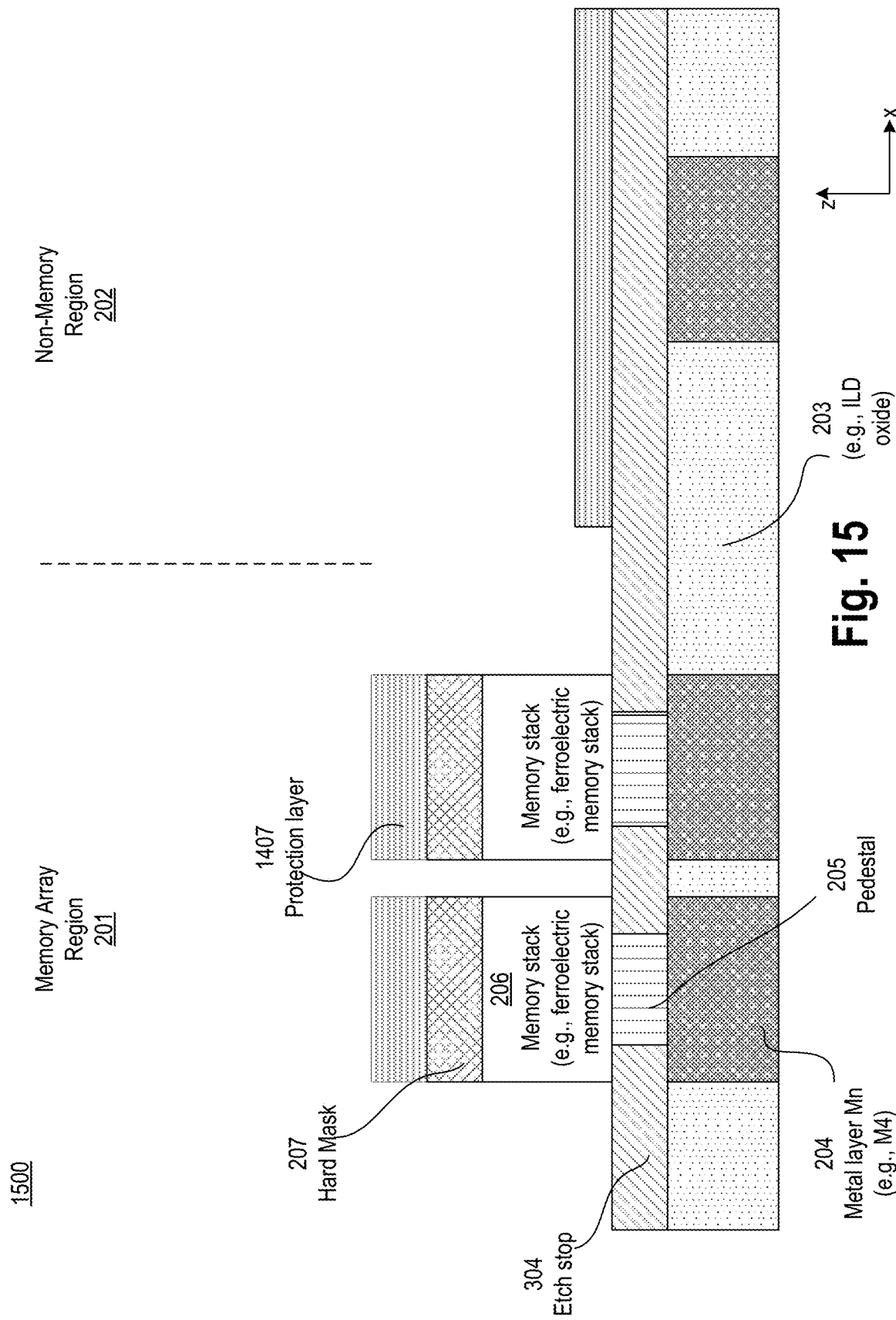
Figure 16:
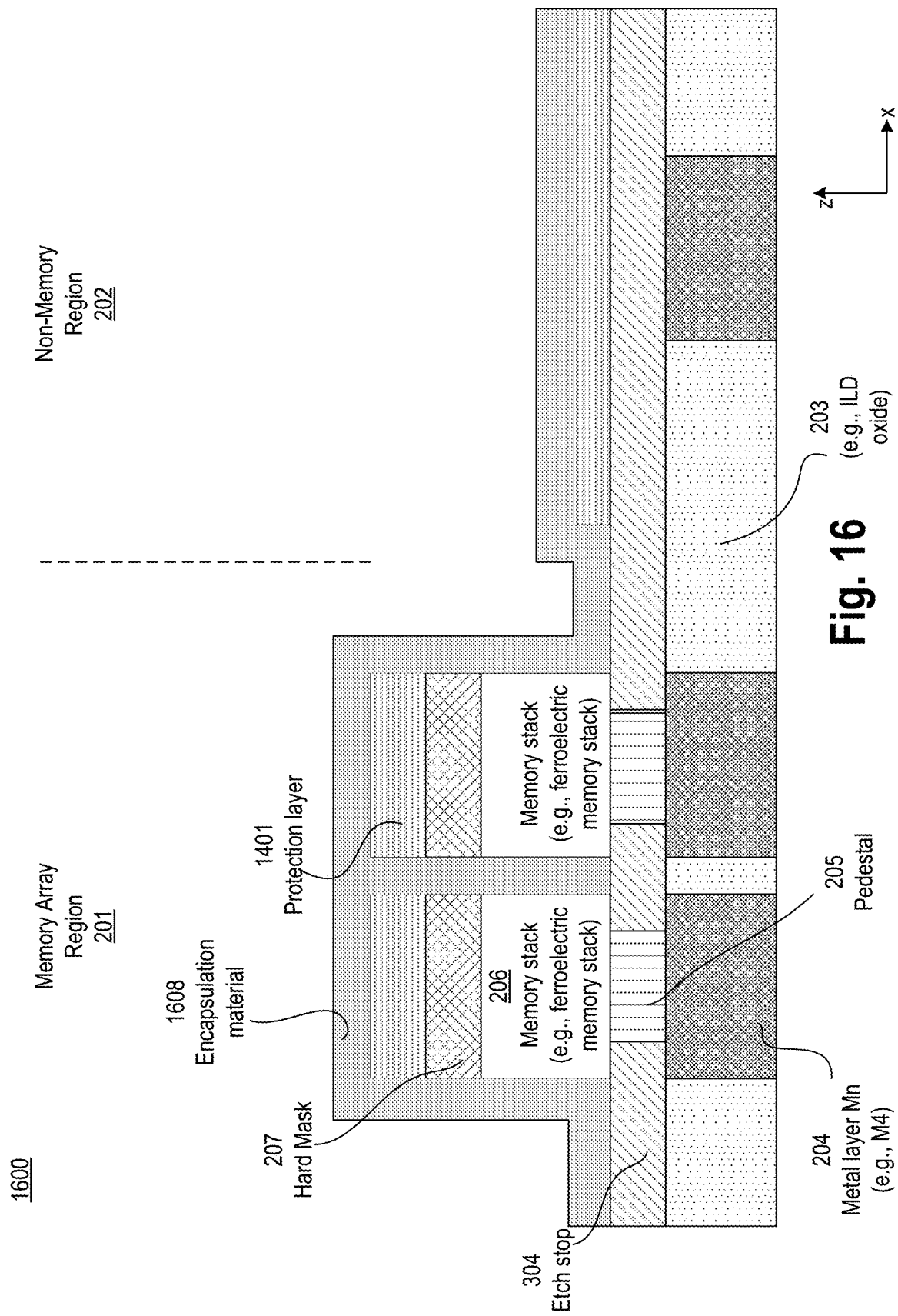
Figure 17:
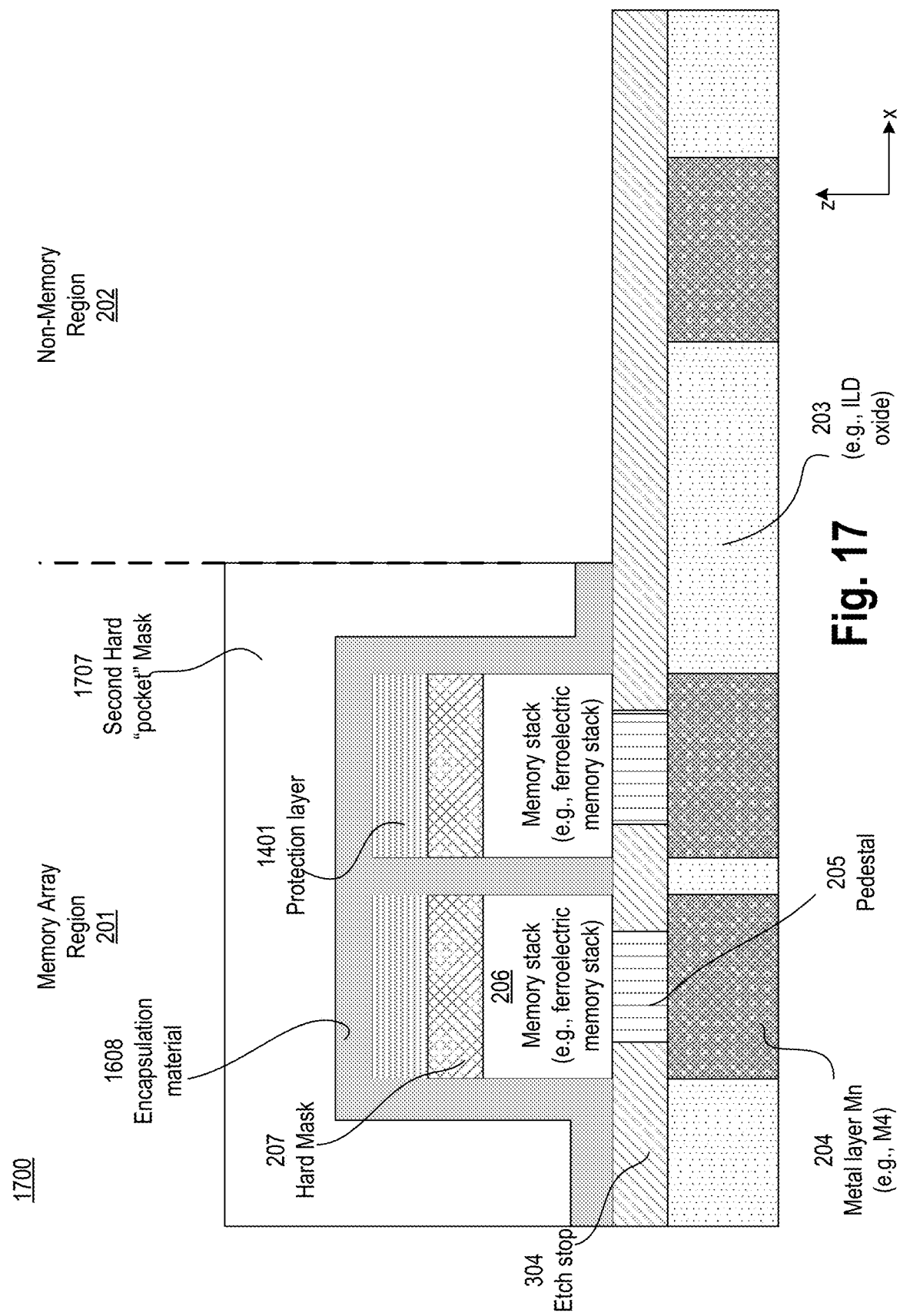
Figure 18:
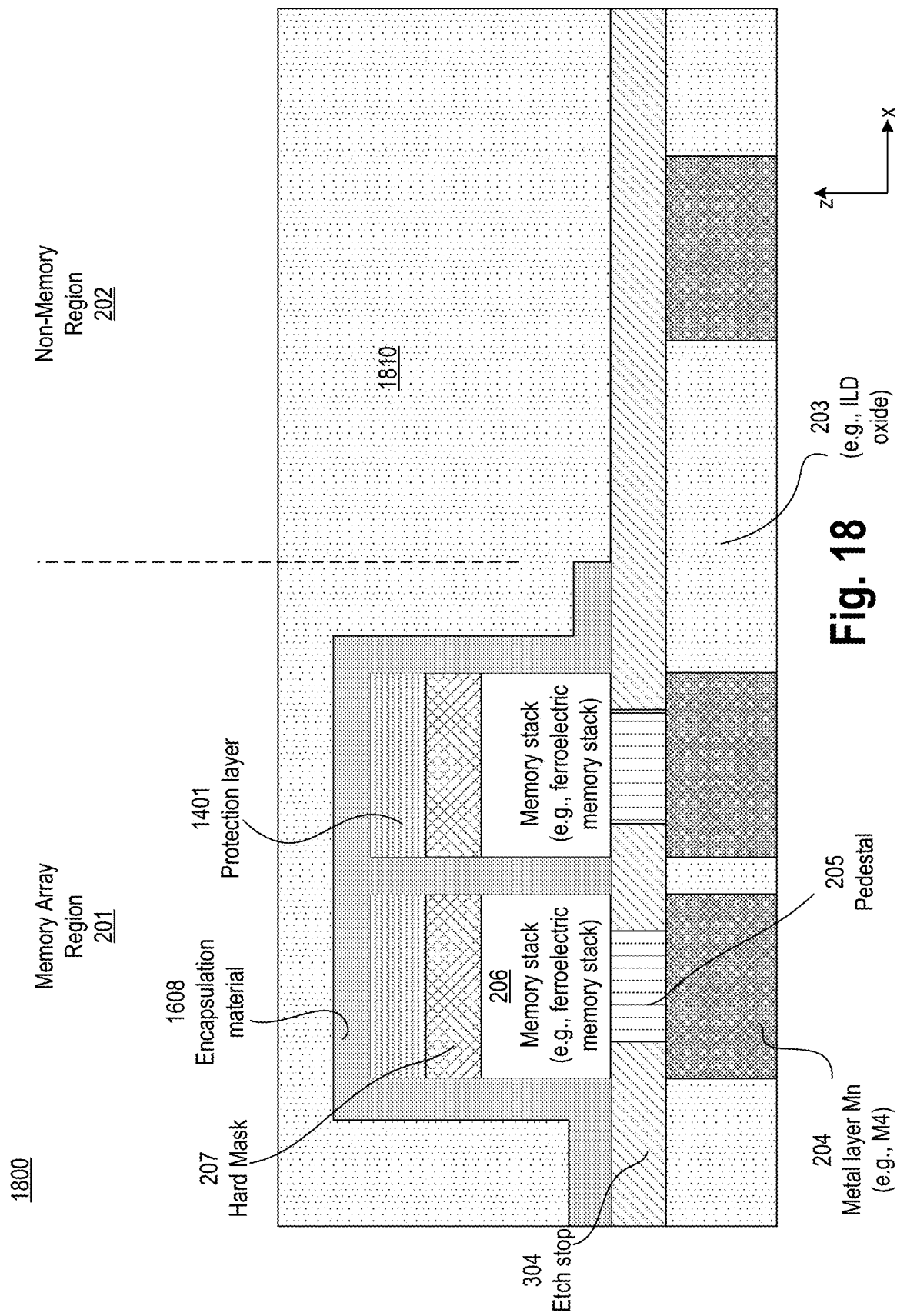
Figure 19A:
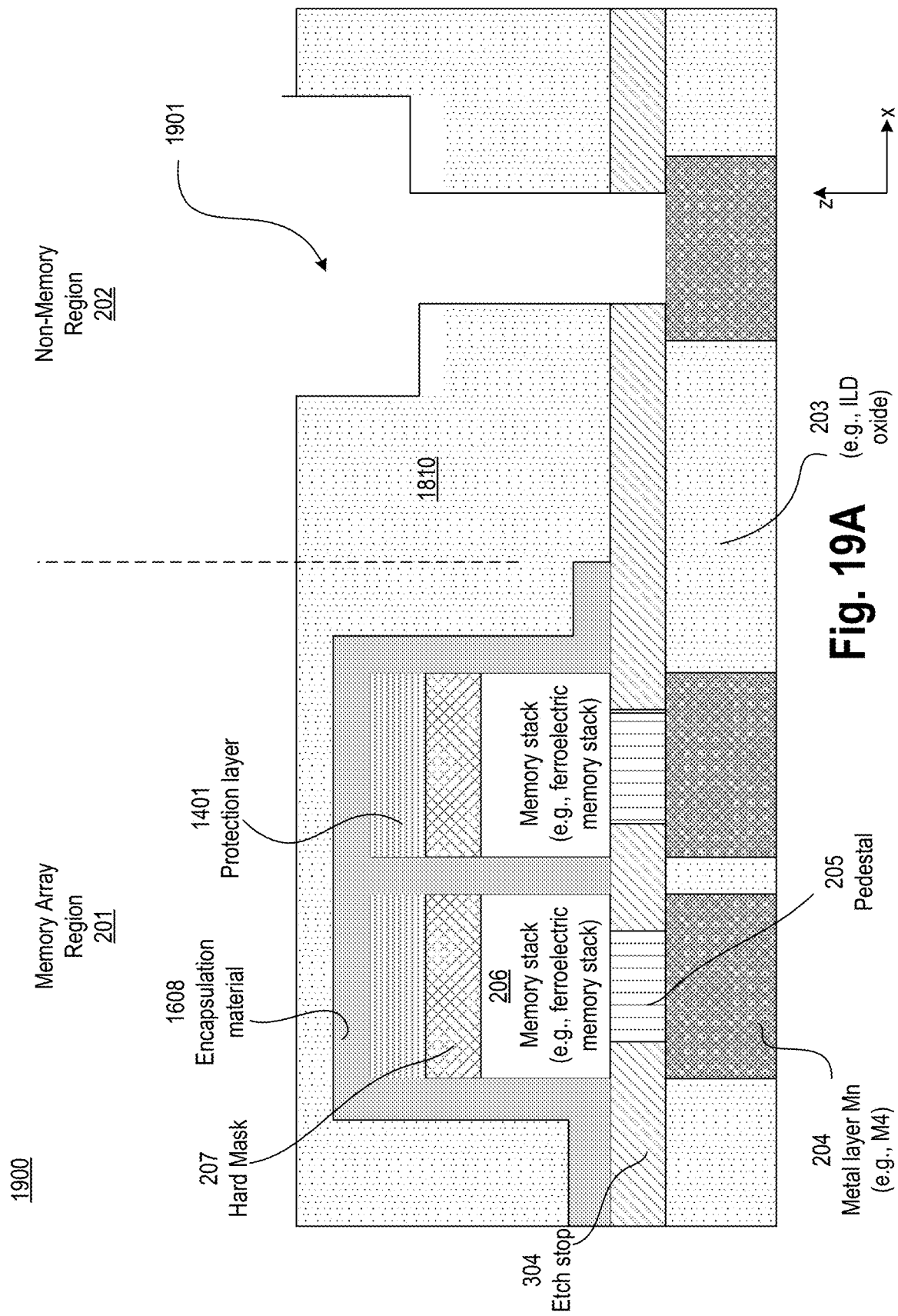
Figure 19B:
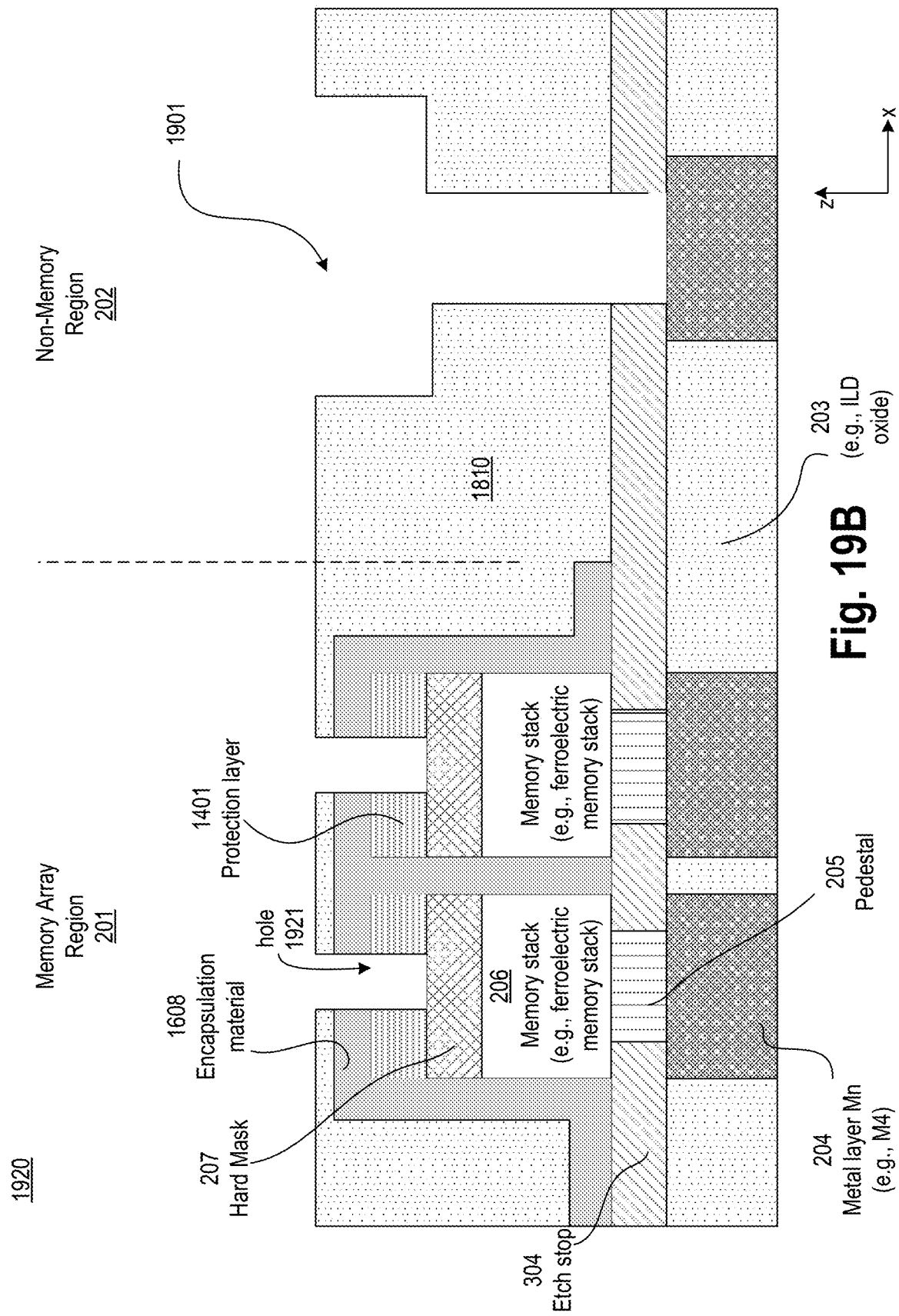
Figure 19C:
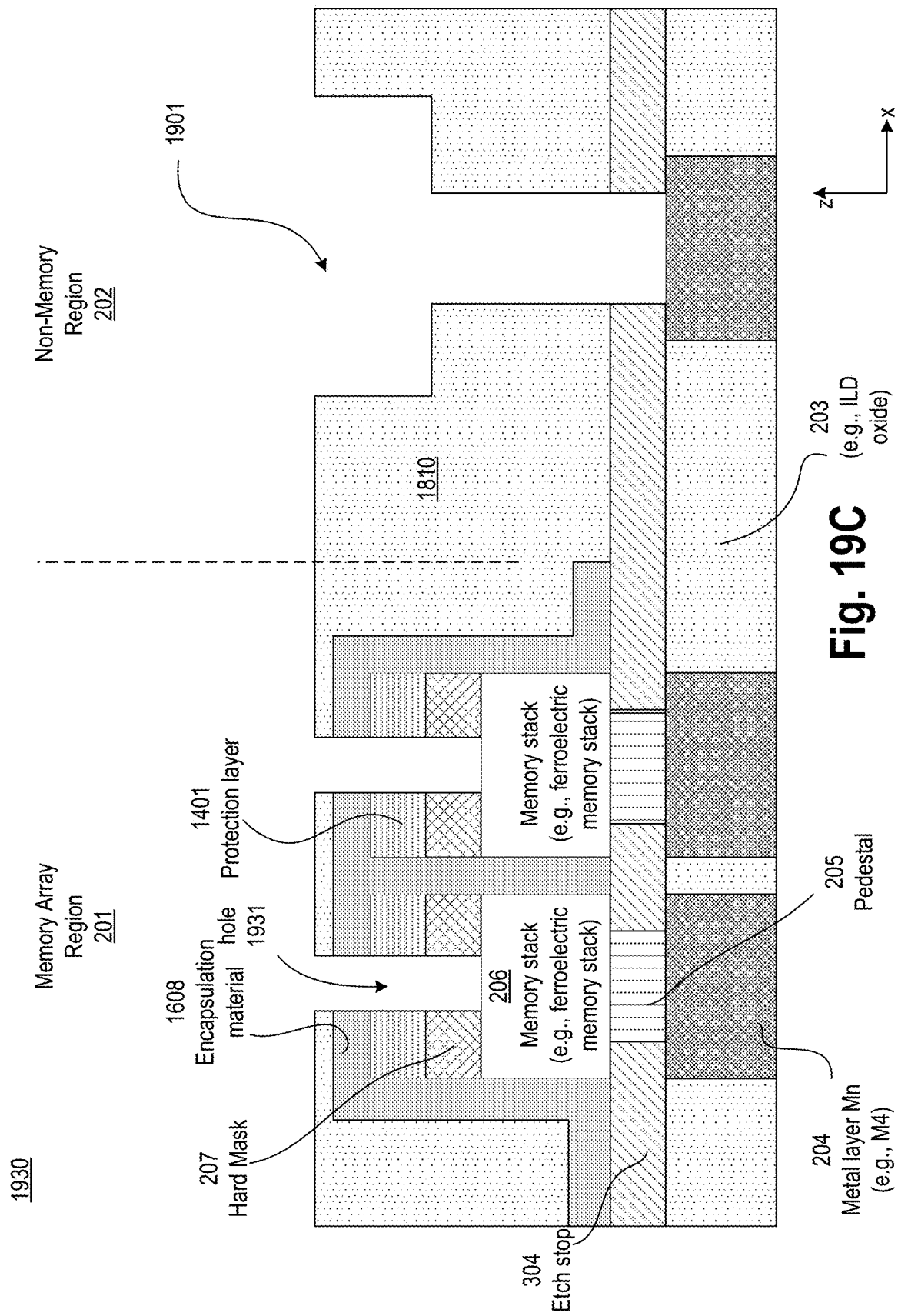

FIG. 2 illustrates cross-section 200 of a die portion having memory area 201 and non-memory area 202, where the etch stop layer in the non-memory area is etched more than the etch stop layer of the memory area. The dotted line here illustrates a separate of memory area 201 and non-memory area 202. Several fabrication processes are already performed here. Cross-section 200 illustrates the case after pillar etching or lithography. Cross-section 200 includes interlayer dielectric (ILD) 203 between metal layer(s) 204. The metal layers can be backend or frontend metal layers. After ILD 203 is polished, etch stop layer 224 (includes 224a and 224b) is deposited over polished ILD 203 and metal layer 204. In memory array region 201, contact to metal layer 204 is made via pedestals 205. Pedestals 205 are formed by etching through etch stop layer 224. After holes for the pedestals are etched, metal is filled in those holes to contact metal layer 204. Etch stop layer 224 is then polished to create a flat pedestal 205. Memory stack is then deposited on pedestal 205. Memory stack 206 may include a number of layers including bottom electrode, dielectric, and top electrode. The bottom electrode is a metal that contacts pedestals 205. The dielectric is between the bottom electrode and the top electrode. The dielectric can be a typical dielectric (e.g., linear dielectric) for a capacitive device for a DRAM bit-cell. For Fe-RAM, the dielectric is replaced with non-linear polar material. The non-linear polar material can be ferroelectric, paraelectric, or non-linear dielectric. A memory stack for Fe-RAM based capacitive device is illustrated with reference to FIGS. 20-21.

Referring back to FIG. 2, after layers for memory stack 206 are deposited over memory array regions 201 and non-memory array region 202, hard mask 207 is deposited over a polished top surface of memory stack 206. Thereafter, pillar lithography is performed to form pillars of memory stack devices that connect to their respective pedestals 204. Typically, non-memory region 202 has a lower pattern density than memory region 201. Since the etch rate is higher in non-memory region 202 (because the density is lower there) compared to the etch rate in memory array region 201, etch stop portion 224b in non-memory region 202 is etched more than etch stop portion 224a in memory array region 201. In some cases, etch stop 224b may be completely etched out during the etch process. To mitigate the extra etching of etch stop 224b, typically thicker etch stop layers 224 are deposited uniformly. Thicker etch stop layer 224 results in increasing the height of memory stack 206. Taller memory stack 206 results in taller dies, which makes downstream process integration very challenging because the non-memory region 202 will have different height than the memory region 201.

FIGS. 3-6, 7A-7B, 8-10, and 11A-11C illustrate cross-sections 300, 400, 500, 600, 700, 720, 800, 900, 1000, 1100, 1120, and 1130, respectively, of a die portion having a memory area and a non-memory area, where the cross-sections of the die use a pocket mask to decouple etching process of the memory array and the non-memory area, in accordance with some embodiments. After ILD 203 is polished, etch stop layer 304 is deposited over polished ILD 203 and metal layer 204. Examples of materials used for ILD 203 include silica (SiO2), hafnium silicate (HfSiO4), zirconium silicate (ZrSiO4), and/or any suitable low-k dielectric. Examples of materials for metal layer 204 include: Cu, Al, Ag, Au, Co, W, Fe, Ta, or any combination of them.

In memory array region 201, contact to metal layer 204 is made via pedestals 205. Pedestals 205 are formed by etching through etch stop layer 304. Materials for pedestals 205 can be suitable conductive material such as Cu, Al, Ag, Au, Co, W, Fe, Ta, TaN, TiN, Ni, Ru, RuOx, Mo, doped poly silicon, or any combination of them. Etch stop layer 304 can include one or more of silicon dioxide (SiO2), silicon nitride (Si3N4), SiON, SiC, SiNC, and photoimagable epoxy.

After holes for the pedestals are etched, metal is filled in those holes to contact metal layer 204. Etch stop layer 224 and top surface of pedestal 205 are then polished to deposit memory stack 206 by methods such as physical vapor deposition (PVD), chemical vapor deposition (CVD), atomic layer deposition (ALD), plasma-enhanced CVD (PE-CVD), plasma-enhanced ALD (PE-ALD), Metal Organic CVD (MO-CVD) as illustrated in cross-section 400. Any suitable process can be used for polishing. For example, chemical mechanical polishing or planarization can be used to smooth the surface of etch stop layer 224 and top surface of pedestal 205 with a combination of chemical and mechanical forces.

Cross-section 400 illustrates a cross-section of the die after deposition of memory stack 206 over the polished etch stop layer 304 and top surface of pedestal 205. Memory stack 206 may include a number of layers deposited by methods such as physical vapor deposition (PVD), chemical vapor deposition (CVD), atomic layer deposition (ALD), plasma-enhanced CVD (PE-CVD), plasma-enhanced ALD (PE-ALD), Metal Organic CVD (MO-CVD). These layers include bottom electrode, dielectric, and top electrode. The bottom electrode is a metal that contacts pedestals 205. These number of layers may span an area covered by a via and one or more metal layers of a process technology node. For example, the height of memory stack 206 can span a height reserved for via1 and metal 2 (V1-M2). In another example, the height of memory stack 206 can span a height reserved for via1, metal 2, via2, and metal 3 (V1-M2-V2-M3). In some examples, the height of memory stack 206 can span a height reserved for via Vn and Metal layer Mn+1, where 'n' is a number. In some examples, the height of memory stack 206 can span a height reserved for series of vias and metal layers (e.g., via Vn, Metal layer Mn+1, via Vn+1, Metal Mn+2, etc. where 'n' is a number).

The dielectric is between the bottom electrode and the top electrode. The dielectric can be a typical dielectric (e.g., linear dielectric) for a capacitive device for a DRAM bit-cell. For Fe-RAM, the dielectric is replaced with non-linear polar material. The non-linear polar material can be ferroelectric, paraelectric, or non-linear dielectric. A memory stack for Fe-RAM based capacitive device is illustrated with reference to FIGS. 20-21. In some embodiments, after polishing a top surface of memory stack 206, hard mask 207 is deposited and its top surface polished as shown in cross-section 500. In other embodiments, the process of polishing is skipped and hard mask 207 is deposited. Hard mask 207 may include materials that can be categorized into organic and inorganic types. Examples of organic type hard masks include amorphous carbon, organo siloxane-based materials with reflection control properties. Examples of inorganic type hard masks include silicon dioxide (SiO2), silicon nitride (SixNy), SiC, SiNC, and photoimagable epoxy, AlxOy, TaN, W, SiN, SiON, SiC, and TiN, Tetra-ethyl Ortho-silicate (TEOS) or tetraethoxysilane (TEOS) bi-layer and tri-layer of these in any combination. These hard masks can be deposited either by chemical vapor deposition process or spin-on processes.

Cross-section 600 illustrates a cross-section of the die after a hard mask patterning process that leaves hard mask 207a over future memory stacks for a random-access memory, and hard mask 207b over non-memory region 202. Cross-section 700 illustrates a die cross-section after pillar lithography that etches through areas unprotected by hard masks 207a, and 207b all the way to etch stop 304. After pillar lithography, encapsulation material 708 is conformally deposited over etch stop 304, sides of memory stack 206

(e.g., 206a), hard mask 207a, side of memory stack 206b, and hard mask 207b. In some embodiments, materials for encapsulation material 708 include one of: AlxOy, HfOx, ZrOx, TaOx, TiOx, SiOx, SiN, SiCN, SiC, SiON, AlSiOx, HfSiOx, TaSiOx, AlN, ZrN, or HfN deposited by methods such as physical vapor deposition (PVD), chemical vapor deposition (CVD), atomic layer deposition (ALD), plasma-enhanced CVD (PE-CVD), plasma-enhanced ALD (PE-ALD), Metal Organic CVD (MO-CVD). The thickness of encapsulation material 708 can be 1-50 nm. In various embodiments, encapsulation material 208 fills the gap between adjacent memory pillars to improve the protection of the memory pillar from ingress of undesired material. In some embodiments, encapsulation material 208 has higher dielectric constant than a dielectric constant of an ILD.

Cross-section 720 illustrates a die cross-section after pillar lithography and etch through areas unprotected by hard masks 207a, and 207b all the way to etch stop 304. After pillar lithography and etch, encapsulation material 708 is conformally deposited over etch stop 304, sides of memory stack 206 (e.g., 206a), hard mask 207a, side of memory stack 206b, and hard mask 207b. Compared to cross-section 700, here a gap exists between adjacent memory stacks. This gap is filled with ILD 721, in accordance with some embodiments.

Cross-section 800 illustrates a cross-section of the die after deposition of hard pocket mask 809 in memory array region 201 over encapsulation material 708. In various embodiments, hard pocket mask 809 forms the first pocket hard mask. It is referred to as a "pocket" mask because it covers a region (a pocket) of the die. This region or pocket is memory array region 201. In some embodiments, hard pocket mask 809 comprises material discussed with reference to hard mask 207 (e.g., 207a, 207b). Hard pocket mask 809 forms the basis of decoupling the process of etching non-memory region 202 from memory array region 201. Hard pocket mask 809 thus allows to minimize or substantially eliminate over etching of etch stop layer 304, which would otherwise result in etch stop 224b as discussed with reference to FIG. 2. In some embodiments, hard pocket mask 809 is then polished using any suitable polishing technique including the polishing mechanisms discussed herein. In other embodiments, hard pocket mask 809 is not polished.

Cross-section 900 illustrates a cross-section of the die after etching of the non-memory region 202 which is not protected by hard pocket mask 809. Encapsulation layer 708 is to etch out leaving most (or substantially most) or all of the etch stop 304 intact for later processing. By removing encapsulation layer 708 in non-memory region 202, standard etching process can be used later to form a via to connect to metal layer 204 in non-memory region 202.

Cross-section 1000 illustrates a cross-section of the die after deposition of ILD 1010 over hard pocket mask 809 and etch stop layer 304 as shown. ILD 1010 may have any of the materials discussed with reference to ILD 203. The top surface of ILD 203 is then polished using any suitable polishing technique include the polishing mechanisms discussed herein.

Cross-section 1100 illustrates a cross-section of the die after via or metal patterning (that forms pattern 1101) in ILD 1010 to expose metal 204 in the non-memory region 202. Since there is no encapsulation layer 708 in non-memory region 202, standard etching process can be used later to form via 1101 through ILD 1010. Via 1101 is then filled with metal and polished.

Cross-section 1120 illustrates a cross-section of the die after via or metal patterning (that forms pattern 1101) in ILD 1010 to expose metal 204 in the non-memory region 202. Compared to cross-section 1100, here holes 1121 are formed by etching pocket mask 809 and encapsulation material 708 to get access to hard mask 207. In various embodiments, hard mask 207 comprises metal, which forms a contact with memory stack 206a. For example, hard mask 207a provides the top electrode for memory stack 206a while pedestal 205 forms the bottom electrode for memory stack 206a. Holes 1121 are subsequently filled with metal and polished.

Cross-section 1130 illustrates a cross-section of the die after via or metal patterning (that forms pattern 1101) in ILD 1010 to expose metal 204 in the non-memory region 202. Compared to cross-section 1100, here holes 1131 are formed by etching pocket mask 809, encapsulation material 708, and hard mask 207 to get access to a top surface of memory stack 206a. In some embodiments, hard mask 207 comprises a non-metal, which is why it is etched to access the top surface of memory stack 206. For example, the top surface for memory stack 206a provides the top electrode while pedestal 205 forms the bottom electrode for memory stack 206a. Holes 1131 are subsequently filled with metal and polished.

FIGS. 12-18, and 19A-19C illustrates cross-sections 1200, 1300, 1400, 1500, 1600, 1700, 1800, 1900, 1920, and 1930, respectively, of a die portion having a memory area and a non-memory area, where the cross-sections use multiple pocket masks to decouple etching process of the memory array and the non-memory area, in accordance with some embodiments. Materials discussed with reference to FIGS. 2-11 are also applicable here. For example, encapsulation material discussed here may include a material from the list of material discussed in FIGS. 2-11 regarding the encapsulation material. Some embodiments describe a fabrication process using multiple pocket masks to decouple the etching process of the memory array area and the non-memory area. This fabrication process (using multiple pocket masks) avoids exposure of memory material into a second pocket etch chamber. In some embodiments, the process of etching memory material is decoupled from the process of etching an encapsulation material.

Cross-section 1200 picks up from process shown in cross-section 500. In some embodiments, a first hard pocket mask 1208 is deposited in memory array region 201 over hard mask layer 207. In various embodiments, first hard pocket mask 1208 is a "pocket" mask that decouples memory array region 201 from non-memory region 202.

Cross-section 1300 illustrates a cross-section of the die after hard mask 207 and memory stack 206 under non-memory region 202 is etched. Any suitable scheme for etching can be used (e.g., dry etch, wet etch). First hard pocket mask 1208 is then etched away exposing hard mask 207.

Cross-section 1400 illustrates a cross-section of the die after protection layer 1407 is deposited over hard mask 207 and etch stop 304. Examples of materials for protection layer 1407 include: SiOx, SiN, Carbon doped Oxide, SiCN, SiC, SiON, HTCHM (high-temperature carbon hard mask), or AlxOy. Cross-section 1500 illustrates a cross-section of the die after pillar lithography and hard mask etch that leaves pillars of memory stacks and portions of protection layer 1407 as shown. Cross-section 1600 illustrates a cross-section of the die after encapsulation material or layer 1608 is conformally deposited over surface etch stop 304, sides of memory stack 206, hard mask 207, and protection layer 1401 as shown. Cross-section 1700 is a cross-section of the die after deposition of the second hard "pocket" mask 1707, which is used to etch out encapsulation layer or material 1608 and protection layer 1401 from the non-memory region 202. As such, etch stop 304 is exposed. As discussed herein, the etch rate in non-memory region 202 is higher than the etch rate on memory region 201 because non-memory region 202 is less dense than memory region 201. The second hard "pocket" mask decouples memory array region 201 from non-memory region 202. This allows the traditional via etch process to continue to contact metal layer 204 in non-memory region 202.

Cross-section 1800 illustrates a cross-section of the die after deposition of ILD 1810. ILD 1810 can be any suitable material as those discussed with reference to ILD 203. The top surface of ILD 1810 is polished using any suitable scheme such as those discussed herein. Cross-section 1900 illustrates a cross-section of the die after hole 1901 for via is etched using traditional fabrication process to contact a future via to metal 204 of non-memory region 202.

Cross-section 1920 illustrates a cross-section of the die after via or metal patterning (that forms pattern 1901) in ILD 1810 to expose metal 204 in the non-memory region 202. Compared to cross-section 1900, here holes 1921 are formed by etching encapsulation material 1608 and protection layer 1401 and to get access to hard mask 207. In various embodiments, hard mask 207 comprises metal, which forms a contact with memory stack 206. For example, hard mask 207 provides the top electrode for memory stack 206 while pedestal 205 forms the bottom electrode for memory stack 206. Holes 1921 are subsequently filled with metal.

Cross-section 1930 illustrates a cross-section of the die after via or metal patterning (that forms pattern 1901) in ILD 1810 to expose metal 204 in the non-memory region 202. Compared to cross-section 1920, here holes 1921 are formed by etching encapsulation material 1608, protection layer 1401, and hard masks 207 to get access to a top surface of memory stack 206. In some embodiments, hard mask 207 comprises a non-metal, which is why it is etched to contact to memory stack 206. For example, the top surface of memory stack 206 provides the top electrode for memory stack 206 while pedestal 205 forms the bottom electrode for memory stack 206. Holes 1931 are subsequently filled with metal.

As discussed herein, after pillar lithography and etch, encapsulation material 1608 is conformally deposited over etch stop 304, sides of memory stack 206 (e.g., 206*a*), hard mask 207*a*, side of memory stack 206*b*, and hard mask 207*b*. In some embodiments, a gap exists between adjacent memory stacks. The gap is between encapsulation material 1608 coupled to the respective memory pillars. This gap is filled with ILD 1820 between the memory pillars (or stacks) similar to that shown in cross-section 720, in accordance with some embodiments.

FIG. 20 illustrates various kinds of planar ferroelectric (FE) capacitors 2000, 2010, 2020, and 2030, respectively, for use in the memory area, in accordance with some embodiments. FE capacitor 2000 comprises refractive inter-metallic 2011*a/b* as a barrier material; conductive oxides 2012*a/b*, and FE material 2013.

Refractive inter-metallic 2011*a/b* maintains the FE properties of the FE capacitor Cfe. In the absence of refractive inter-metallic 2011*a/b*, the ferroelectric material or the paraelectric material 2013 of the capacitor may lose its potency. In some embodiments, refractive inter-metallic 2011*a/b* comprises Ti and Al (e.g., TiAl compound). In some embodiments, refractive inter-metallic 2011*a/b* comprises one or more of Ta, W, and/or Co.

For example, refractive inter-metallic 2011*a/b* includes a lattice of Ta, W, and Co. In some embodiments, refractive inter-metallic 2011*a/b* includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. Barrier layer 2011*a* is coupled to plate-line or power-line (PL) 215.

In some embodiments, sidewall barrier seal 2021*a* and 2021*b* (insulating material such as Ti—Al—O, Al2O3, or MgO) is placed around layers 2011*a*, 2012*a*, 2013, 2012*b*, and 2011*b* while the top and bottom surfaces of 2011*a* and 2011*b* are exposed for coupling to metal layers, vias, or a metallic pedestal. In some embodiments, sidewall barrier seals 2021*a*, 2021*b*, 2021*c*, and 2021*d* (insulating material such as Ti—Al—O, Al2O3, or MgO) are placed around layers 2011*a*, 2012*a*, 2013, 2012*b*, and 2011*b* and part of the top surfaces of 2011*a* and 2011*b* are exposed for coupling to metal layers or electrodes, vias, or a metallic pedestal. In some embodiments, sidewall barrier seal 2021*a*, 2021*b*, 2021*c*, 2021*d*, 2021*e*, and 2021*f* (insulating material such as Ti—Al—O, Al2O3, or MgO) is placed around layers 2011*a*, 2012*a*, 2013, 2012*b*, and 2011*b* and part of the top surfaces of 2011*a* and 2011*b* and bottom surface 2021*e* and 2021*f* are exposed for coupling to metal layers or electrodes, vias, or a metallic pedestal.

In various embodiments, FE material 2013 can be any suitable low voltage FE material that allows the FE material to switch its state by a low voltage (e.g., 100 mV). Threshold in FE material 2013 has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of FE layer 2013. A perfect epitaxial, single crystalline FE layer will show higher squareness (e.g., ratio is closer to 1) compared to a poly crystalline FE. This perfect epitaxial can be accomplished by the use of lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, FE material 2013 comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides).

In some embodiments, FE material 2013 is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for FE material 2013. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves spontaneous distortion in the range of 0.3 to 2%. For chemically substituted BiFeO3, BiCrO3, BiCoO3 class of materials, La or rare earth substitution into the Bi site can tune the spontaneous distortion, or any combination of BixFeyOz with La or rare earth doping. In some embodiments, FE material 2013 is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, FE material 2013 comprises a stack of layers including low voltage FE material between (or sandwiched between) conductive oxides. In various embodiments, when FE material 2013 is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for FE material 2013, conductive oxides 2012a/b can include one or more of: $IrO_2$, $RuO_2$, $PdO_2$, $OSO_2$, or $ReO_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides 2012a/b. In some embodiments, perovskite includes one of: BaTiO3, PbTiO3, KNbO3, or NaTaO3.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O, La-substituted PbTiO3, PMN-PT based relaxor ferroelectrics.

In some embodiments, FE material 2013 comprises one or more of: Hafnium (Hf), Zirconium (Zr), Aluminum (Al), Silicon (Si), their oxides or their alloyed oxides. In some embodiments, FE material 2013 includes one or more of: Al(1-x)Sc(x)N, Ga(1-x)Sc(x)N, Al(1-x)Y(x)N or Al(1-x-y)Mg(x)Nb(y)N, x doped HfO2, where x includes one of: Al, Ca, Ce, Dy, Er, Gd, Ge, La, Sc, Si, Sn, Zr, or Y, wherein 'x' is a fraction. In some embodiments, FE material 2013 includes one or more of: Bismuth ferrite (BFO), lead zirconate titanate (PZT), BFO with doping material, or PZT with doping material, wherein the doping material is one of Nb or La; and relaxor ferroelectrics such as PMN-PT.

In some embodiments, FE material 2013 includes Bismuth ferrite (BFO), BFO with a doping material where in the doping material is one of Lanthanum, or any element from the lanthanide series of the periodic table. In some embodiments, FE material 2013 includes lead zirconium titanate (PZT), or PZT with a doping material, wherein the doping material is one of La, Nb. In some embodiments, FE material 2013 includes a relaxor ferroelectric, which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST).

In some embodiments, FE material 2013 includes Hafnium oxides of the form, Hf1-x Ex Oy where E can be Al, Ca, Ce, Dy, er, Gd, Ge, La, Sc, Si, Sr, Sn, or Y. In some embodiments, FE material 105 includes Niobate type compounds LiNbO3, LiTaO3, Lithium iron Tantalum Oxy Fluoride, Barium Strontium Niobate, Sodium Barium Niobate, or Potassium strontium niobate.

In some embodiments, FE material 2013 comprises multiple layers. For example, alternating layers of [Bi2O2]2+, and pseudo-perovskite blocks (Bi4Ti3O12 and related *Aurivillius* phases), with perovskite layers that are n octahedral layers in thickness can be used. In some embodiments, FE material 2013 comprises organic material. For example, Polyvinylidene fluoride or polyvinylidene difluoride (PVDF).

In some embodiments, FE material 2013 comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3, and/or other variants of LuxFeyOz (where 'x', 'y', and 'z' are numbers or fractions). In various embodiments, when FE material 2013 comprises hexagonal ferroelectrics, the conductive oxides are of A2O3 (e.g., In2O3, Fe2O3) and ABO3 type, where 'A' is a rare earth element and B is Mn, transition metal dichalcogenides (TMD) or chalcogenide of the type AB2, where 'A' is a transition metal and 'B' is a chalcogen.

In some embodiments, FE material 2013 comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material 2013 for storing the charge state, the embodiments are also applicable for paraelectric material. For example, the capacitor of various embodiments can be formed using paraelectric material instead of ferroelectric material.

While various embodiments here are described with reference to ferroelectric material for storing the charge state, the embodiments are also applicable for paraelectric material. For example, material 2013 of various embodiments can be formed using paraelectric material instead of ferroelectric material. In some embodiments, paraelectric material includes one of: SrTiO3, Ba(x)Sr(y)TiO3 (where x is −0.5, and y is 0.95), HfZrO2, Hf—Si—O, La-substituted PbTiO3, lead zirconate titanate (PZT), or lead magnesium niobate-lead titanate (PMN-PT) based relaxor ferroelectrics.

In some embodiments, thickness $t_{111}$ of refractive inter-metallic layer 2011a/b is in a range of 1 nm to 25 nm. In some embodiments, thickness $t_{112}$ of the conductive oxide layers 2012a/b is in a range of 1 nm to 25 nm. In some embodiments, thickness $t_{113}$ of the FE material (e.g., perovskite, hexagonal ferroelectric, or improper ferroelectric) 2013a/b is in a range of 1 nm to 25 nm. In some embodiments, the lateral thickness $t_{120}$ of the sidewall barrier seal 2021a/b (insulating material) is in a range of 0.1 nm to 40 nm. In some embodiments, the lateral thickness $L_{Cfe}$ of the capacitive structure (without sidewall barrier) is in a range of 5 nm 400 nm. In some embodiments, the height $H_{Cfe}$ of the capacitive structure is in a range of 1 nm 200 nm. In some embodiments, the FE capacitive structure is without refractive inter-metallic layers 2011a/b. In that case, conductive oxides layers 2012a/b are in direct contact with the contacts, vias, or metals (e.g., PL, source/drain region contact of transistor MN). In some embodiments, sidewall barrier seal 2021a/b is not present. In one such embodiment, the sidewalls of the layers 2011a/b, 2012a/n, and 2013 are in direct contact with ILD (interlayer dielectric) such as SiO2.

FIG. 21 illustrates pillar ferroelectric capacitor 2100 for use in the memory area, in accordance with some embodiments. In various embodiments, FE pillar capacitor 2100 is cylindrical in shape. In some embodiments, FE pillar capacitor 2100 is rectangular in shape. Taking the cylindrical shaped case for example, in some embodiments, the layers of FE pillar capacitor 2100 from the center going outwards include oxide scaffolding 2102, bottom electrode 2101a, first conductive oxide 2112a, FE material 2113, second conductive oxide 2112b, and top electrode 2101b. A cross-sectional view along the "ab" dashed line is illustrated in the middle of FIG. 21. In some embodiments, bottom electrode 2101a is conformally deposited over oxide scaffolding 2102 (e.g., SiO2 or any other suitable dielectric). In some embodiments, first conductive oxide 2112a is conformally deposited over bottom electrode 2101a. In some embodiments, FE material 2113 is conformally deposited over first conductive oxide 2112a. In some embodiments, second conductive oxide 2112b is conformally deposited over FE material 2113. In some embodiments, top electrode 2101b is conformally deposited over second conductive oxide 2112b. In some embodiments, the oxide scaffolding is etched and metal is deposited into it which becomes part of bottom electrode 2101a. In some embodiments, a top section of FE pillar capacitor 2100 that forms an upside-down 'U' shape is chopped off (e.g., by etching). This allows bottom electrode 2101a to be accessible from the top and bottom of FE pillar capacitor 2100, where bottom electrode 2101a is in the center while top electrode 2101b is on an outer circumference of FE pillar capacitor 2100.

In various embodiments, the choice of materials for FE pillar capacitor 2100 are similar to the choice of material for FE planar capacitor 2000. For example, the materials for FE pillar capacitor 2100 can be selected from a same group of materials listed for FE planar capacitor 2000 in FIG. 20. For example, material for bottom electrode 2101a corresponds to bottom electrode 2011, material for conductive oxide 2012b corresponds to first conductive oxide 2112a, FE material 2113 corresponds to FE material 2013, material for second conductive oxide 2012a corresponds to second conductive oxide 2112b, and material for top electrode 2011 corresponds to top electrode 2101b.

In some embodiments, a first refractive inter-metallic layer (not shown) is formed between FE material 2113 and first conductive oxide 2112a. In some embodiments, a second refractive inter-metallic layer (not shown) is formed between FE material 2113 and second conductive oxide 2112b. In these cases, the first and second refractive inter-metallic layers are directly adjacent to their respective conductive oxide layers and to FE material 2113. The refractive inter-metallic layer maintains the FE properties of FE material 2113. In the absence of a refractive inter-metallic layer, the ferroelectric material 2112 (or the para-electric material) of pillar capacitor 2100 may lose its potency. In some embodiments, refractive inter-metallic layer comprises Ti and Al (e.g., TiAl compound). In some embodiments, refractive inter-metallic layer comprises one or more of Ta, W, and/or Co. Material discussed with reference to layers 2011a and 2011b can be used for the first and second refractive inter-metallic layers. The thicknesses of the layers of FE pillar capacitor 2100 are of the same range as similar layers discussed in FIG. 20 for FE planar capacitor 2000.

The various cross-sections of the die are in-lieu of method flowcharts. In some embodiments, the processes discussed with reference to the various cross-sections of the die are executed by software, hardware, or a combination of them. In some embodiments, the software includes machine-readable instructions that are executed by one or more machines (e.g., computer, processor, hardware, fabrication tools, etc.). These machine-readable instructions are stored in a machine-readable storage media (e.g., memory).

Figure 22:
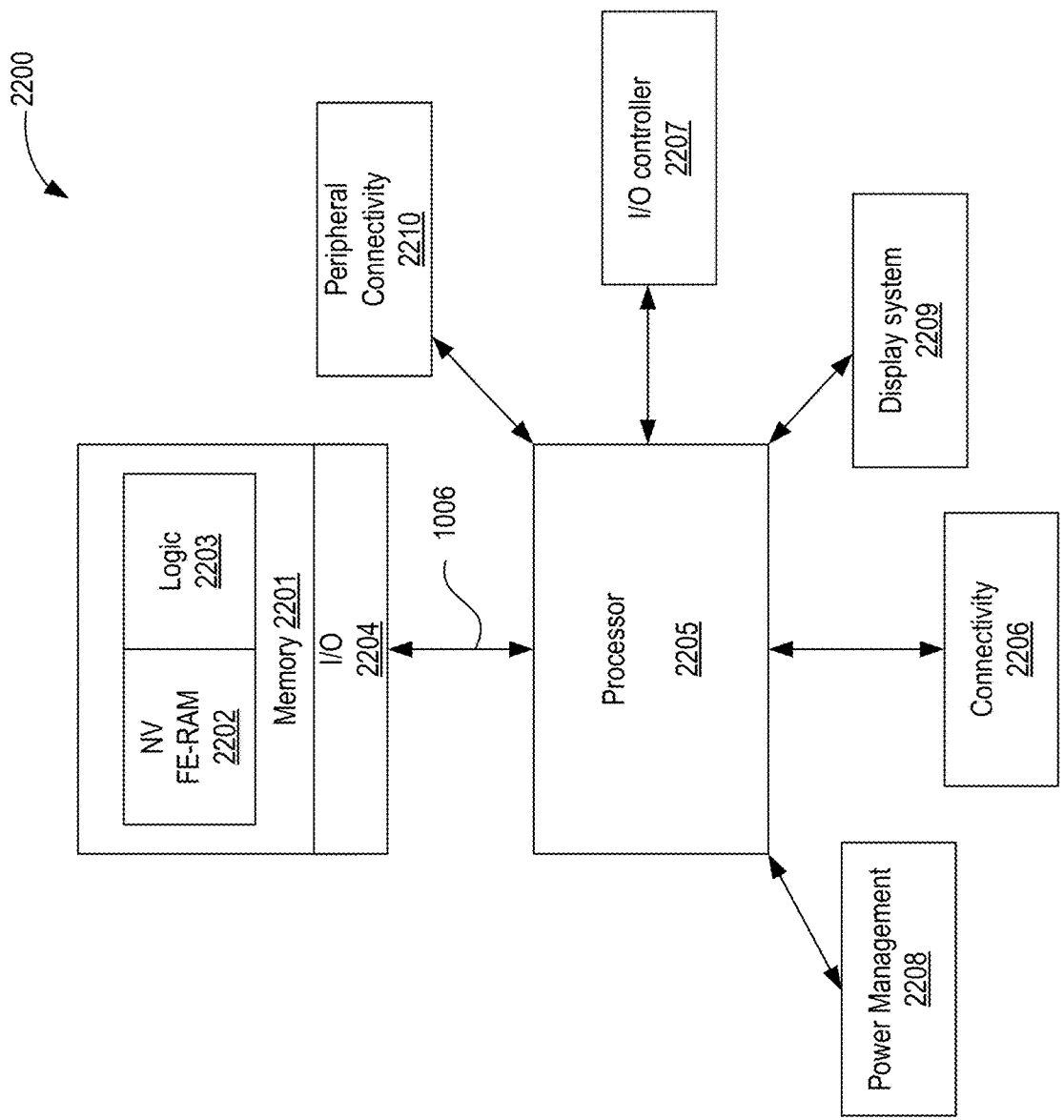
FIG. 22 illustrates a system-on-chip (SOC) that uses embedded memory fabricated using the pocket mask flow or the multiple pocket masks, in accordance with some embodiments.

FIG. 22 illustrates system-on-chip (SOC) 2200 that uses embedded memory fabricated using the pocket mask flow or the multiple pocket masks, in accordance with some embodiments. The FE device structure can be formed in the backend of SOC 2200 while the transistors are formed in the frontend of SOC 2200, in accordance with some embodiments. In some embodiments, the FE device structure and the transistors are formed in the backend of SOC 2200. In some embodiments, the FE device structure and the transistors are formed in the frontend of the SOC 2200. In some embodiments, SOC 2200 comprises memory 2201 having static random-access memory (SRAM) or FE based random access memory FE-RAM, or any other suitable memory. The memory can be non-volatile (NV) or volatile memory. Memory 2201 may also comprise logic 2203 to control memory 2202. For example, write and read drivers are part of logic 2203. These drivers and other logic are implemented using the majority or threshold gates of various embodiments. The logic can comprise majority or threshold gates and traditional logic (e.g., CMOS based NAND, NOR etc.).

SOC further comprises a memory I/O (input-output) interface 2204. The interface may be double-data rate (DDR) compliant interface or any other suitable interface to communicate with a processor. Processor 2205 of SOC 2200 can be a single core or multiple core processor. Processor 2205 can be a general-purpose processor (CPU), a digital signal processor (DSP), a graphics processing unit (GPU), or an Application Specific Integrated Circuit (ASIC) processor. In some embodiments, processor 2205 is an artificial intelligence (AI) processor (e.g., a dedicated AI processor, a processor circuitry, a graphics processor configured as an AI processor). In various embodiments, processor 2205 (or processor circuitry 2205) is configured to execute one or more instructions.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, Al processor 2205 has reduced latency of computing the training model and using the training model, which reduces the power consumption of such Al processor systems.

Processor 2205 may be coupled to a number of other chip-lets that can be on the same die as SOC 2200 or on separate dies. These chip-lets include connectivity circuitry 2206, I/O controller 2207, power management 2208, and display system 2209, and peripheral connectivity 2210.

Connectivity 2206 represents hardware devices and software components for communicating with other devices. Connectivity 2206 may support various connectivity circuitries and standards. For example, connectivity 2206 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 2206 may support non-cellular standards such as WiFi.

I/O controller 2207 represents hardware devices and software components related to interaction with a user. I/O controller 2207 is operable to manage hardware that is part of an audio subsystem and/or display subsystem. For example, input through a microphone or other audio device can provide input or commands for one or more applications or functions of SOC 2200. In some embodiments, I/O controller 2207 illustrates a connection point for additional devices that connect to SOC 2200 through which a user might interact with the system. For example, devices that can be attached to the SOC 2200 might include microphone devices, speaker or stereo systems, video systems or other display devices, keyboard or keypad devices, or other I/O devices for use with specific applications such as card readers or other devices.

Power management 2208 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 2208 may accordingly put such logic into low power state without the worry of losing data. Power management may select a power state according to Advanced Configuration and Power Interface (ACPI) specification for one or all components of SOC 2200.

Display system 2209 represents hardware (e.g., display devices) and software (e.g., drivers) components that provide a visual and/or tactile display for a user to interact with the processor 2205. In some embodiments, display system 2209 includes a touch screen (or touch pad) device that provides both output and input to a user. Display system 2209 may include a display interface, which includes the particular screen or hardware device used to provide a display to a user. In some embodiments, the display interface includes logic separate from processor 2205 to perform at least some processing related to the display.

Peripheral connectivity 2210 may represent hardware devices and/or software devices for connecting to peripheral devices such as printers, chargers, cameras, etc. Peripheral connectivity 2210 say support communication protocols, e.g., PCIe (Peripheral Component Interconnect Express), USB (Universal Serial Bus), Thunderbolt, High Definition Multimedia Interface (HDMI), Firewire, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples illustrates the various embodiments. Any one example can be combined with other examples described herein.

Example 1: A method for fabricating an embedded memory, the method comprising: removing a memory material from a non-memory area of a die, wherein the memory material is adjacent to an etch stop layer; removing a hard mask material over the non-memory area; and etching an encapsulation layer of the non-memory area, while maintaining the encapsulation layer adjacent to a memory material in a memory area of the die.

Example 2: The method of example 1 comprising: applying a pocket mask over the encapsulation layer of the memory area to enable a process of etching of the encapsulation layer from the non-memory area, wherein the encapsulation layer remains adjacent to the hard mask material, wherein the hard mask material is over the memory material of the memory area.

Example 3: The method of example 2 comprising etching of the encapsulation layer to form a via over the hard mask material, wherein the hard mask material is over the memory material.

Example 4: The method of example 1 comprising: depositing an etch stop layer over a metal layer, wherein the etch stop layer is deposited over the non-memory area and the memory area; etching a portion of the etch stop layer to access the metal layer within the memory area of the die; forming a pedestal over the metal layer by depositing metal into the etched portion of the etch stop layer; and polishing a surface of the pedestal down to a top surface of the etch stop layer.

Example 5: The method of example 4 comprising: depositing the memory material over the pedestal and the etch stop layer; and depositing the hard mask material over the memory material.

Example 6: The method of example 5 comprising applying pillar etch and hard mask patterning on the hard mask material, wherein an etch rate is higher in the non-memory area than in the memory area during the hard mask patterning and/or applying pillar etch.

Example 7: The method of example 6 comprising: applying pillar etch on the memory material down to a top surface of the etch stop layer; and conformally depositing the encapsulation layer such that the encapsulation layer is adjacent to the hard mask material, the memory material, and the top surface of the etch stop layer.

Example 8: The method of example 7 comprising: depositing interlayer dielectric over the encapsulation layer and part of the etch stop layer; polishing the interlayer dielectric to planarize the interlayer dielectric in the non-memory area and the non-memory area; and etching the polished interlayer dielectric and a portion of the etch stop layer.

Example 9: The method of example 1, wherein the memory material comprises a capacitor.

Example 10: The method of example 1, wherein the memory material is part of dynamic random-access memory.

Example 11: The method of example 9, wherein the capacitor comprises non-linear polar material which includes one of: ferroelectric material, paraelectric material, or non-linear dielectric.

Example 12: The method of example 11, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, Er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 13: A machine-readable storage media having machine-readable instructions stored thereon that when executed cause one or more machines to perform a method comprising: removing memory material from a non-memory area of a die, wherein the memory material is adjacent to an etch stop layer; removing a hard mask material over the non-memory area; and etching an encapsulation layer of the non-memory area, while maintaining the encapsulation layer adjacent to a memory material in a memory area of the die.

Example 14: The machine-readable storage media of example 13 having machine-readable instructions stored thereon that when executed cause one or more machines to perform a further method comprising: applying a pocket mask over the encapsulation layer of the memory area to enable a process of etching of the encapsulation layer from the non-memory area, wherein the encapsulation layer remains adjacent to the hard mask material, wherein the hard mask material is over the memory material of the memory area.

Example 15: The machine-readable storage media of example 14 having machine-readable instructions stored thereon that when executed cause one or more machines to perform a further method comprising: etching of the encapsulation layer to form a via, over the hard mask material which is over the memory material.

Example 16: A method comprising: applying a pocket mask over an encapsulation layer of a memory area of a die to enable a process of etching of the encapsulation layer from a process of etching a non-memory area, wherein the encapsulation layer remains adjacent to a hard mask material which is over a memory material of the memory area; depositing an interlayer dielectric over the encapsulation layer and part of an etch stop layer of the non-memory area; polishing the interlayer dielectric to planarize the interlayer dielectric over the memory area and the non-memory area; and etching the polished interlayer dielectric and a portion of the etch stop layer in the non-memory area.

Example 17: The method of example 16 comprising: removing the memory material from the non-memory area of the die, wherein the memory material is adjacent to the etch stop layer; removing the hard mask material over the non-memory area; and etching the encapsulation layer of the non-memory area, while maintaining the encapsulation layer adjacent to the memory material in the memory area of the die.

Example 18: The method of example 16 comprising: depositing the etch stop layer over a metal layer, wherein the etch stop layer is deposited over the non-memory area and the memory area; etching a portion of the etch stop layer to access the metal layer within the memory area of the die; forming a pedestal over the metal layer by depositing metal into the etched portion of the etch stop layer; and polishing a surface of the pedestal down to a top surface of the etch stop layer.

Example 19: The method of example 18 comprising: depositing the memory material over the pedestal and the etch stop layer; and depositing the hard mask material over the memory material.

Example 20: The method of example 19 comprising applying pillar etch and hard mask patterning on the hard mask material, wherein an etch rate is higher in the non-memory area than in the memory area during the hard mask patterning and/or applying pillar etch.

Example 1a: A method for fabricating an embedded memory, the method comprising: applying a first pocket mask to a memory area of a die, wherein the first pocket mask is over a hard mask that extends from the memory area to a non-memory area of the die, wherein the hard mask is over a memory material stack that extends from the memory area to the non-memory area of the die, wherein the memory material stack is over at least one pedestal and an etch stop layer; etching the hard mask and the memory material stack in the non-memory area down to a top surface of the etch stop layer; depositing a protection material over the hard mask in the memory area and over the etch stop layer in the non-memory area; and applying a second pocket mask to remove the protection material in the non-memory area while maintaining the protection material in the memory area.

Example 2a: The method of example 1a comprising: depositing an etch stop layer over a metal layer, wherein the etch stop layer is deposited over the non-memory area and the memory area; etching a portion of the etch stop layer to access the metal layer within the memory area of the die; forming the at least one pedestal over the metal layer by depositing metal into the etched portion of the etch stop layer; and polishing a surface of the at least one pedestal down to a top surface of the etch stop layer.

Example 3a: The method of example 2a comprising: depositing the memory material stack over the at least one pedestal and the etch stop layer; and depositing the hard mask over the memory material stack.

Example 4a: The method of example 3a comprising applying pillar etch and hard mask patterning on the protection material, wherein an etch rate is higher in the non-memory area than in the memory area during the hard mask patterning and/or applying pillar etch.

Example 5a: The method of example 4a comprising: applying pillar etch on the memory material stack down to a top surface of the etch stop layer, wherein part of protection material is on part of the etch stop layer; and conformally depositing an encapsulation layer such that the encapsulation layer is adjacent to the protection material, the hard mask, the memory material stack, and the top surface of the etch stop layer.

Example 6a: The method of example 5a comprising: depositing interlayer dielectric over the encapsulation layer and part of the etch stop layer after applying the second pocket mask; polishing the interlayer dielectric to planarize a top surface of the interlayer dielectric; and etching the polished interlayer dielectric and a portion of the etch stop layer.

Example 7a: The method of example 1a, wherein the memory material stack comprises a capacitor.

Example 8a: The method of example 1a, wherein the memory material stack is part of dynamic random-access memory.

Example 9a: The method of example 7a, wherein the capacitor comprises non-linear polar material which includes one of: ferroelectric material, paraelectric material, or non-linear dielectric.

Example 10a: The method of example 9a, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 11a: A machine-readable storage media having machine-readable instructions stored thereon that when executed cause one or more machines to perform a method comprising: applying a first pocket mask to a memory area of a die, wherein the first pocket mask is over a hard mask that extends from the memory area to a non-memory area of the die, wherein the hard mask is over a memory material stack that extends from the memory area to the non-memory area of the die, wherein the memory material stack is over at least one pedestal and an etch stop layer; etching the hard mask and the memory material stack in the non-memory area down to a top surface of the etch stop layer; depositing a protection material over the hard mask in the memory area and over the etch stop layer in the non-memory area; and applying a second pocket mask to remove the protection material in the non-memory area while maintaining the protection material in the memory area.

Example 12a: The machine-readable storage media of example 11a having machine-readable instructions stored thereon that when executed cause one or more machines to perform a further method comprising: depositing an etch stop layer over a metal layer, wherein the etch stop layer is deposited over the non-memory area and the memory area; etching a portion of the etch stop layer to access the metal layer within the memory area of the die; forming the at least one pedestal over the metal layer by depositing metal into the etched portion of the etch stop layer; and polishing a surface of the at least one pedestal down to a top surface of the etch stop layer.

Example 13a: The machine-readable storage media of example 12a having machine-readable instructions stored thereon that when executed cause one or more machines to perform a further method comprising: depositing the memory material stack over the at least one pedestal and the etch stop layer; and depositing the hard mask over the memory material stack.

Example 14a: The machine-readable storage media of example 13a having machine-readable instructions stored thereon that when executed cause one or more machines to perform a further method comprising: comprising applying pillar etch and hard mask patterning on the protection material, wherein an etch rate is higher in the non-memory area than in the memory area during the hard mask patterning and/or applying pillar etch.

Example 15a: A method for fabricating an embedded memory, the method comprising: applying a pocket mask to remove a protection material in a non-memory area of a die while maintaining the protection material in a memory area of the die; and depositing an interlayer dielectric on the protection material in the memory area of the die, wherein the protection material is over a hard mask, and wherein the hard mask is over a memory material stack.

Example 16a: The method of example 15a, wherein the pocket mask is a first pocket mask, wherein the method comprising: applying a second pocket mask to the memory area of a die, wherein the second pocket mask is over the hard mask that extends from the memory area to a non-memory area of the die, wherein the hard mask is over the memory material stack that extends from the memory area to the non-memory area of the die, wherein the memory material stack is over at least one pedestal and an etch stop layer; etching the hard mask and the memory material stack in the non-memory area down to a top surface of the etch stop layer; and depositing the protection material over the hard mask in the memory area and over the etch stop layer in the non-memory area.

Example 17a: The method of example 16a comprising: depositing an etch stop layer over a metal layer, wherein the etch stop layer is deposited over the non-memory area and the memory area; etching a portion of the etch stop layer to access the metal layer within the memory area of the die; forming the at least one pedestal over the metal layer by depositing metal into the etched portion of the etch stop layer; and polishing a surface of the at least one pedestal down to a top surface of the etch stop layer.

Example 18a: The method of example 17a comprising: depositing the memory material stack over the at least one pedestal and the etch stop layer; and depositing the hard mask over the memory material stack.

Example 19a: The method of example 18a comprising applying pillar etch and hard mask patterning on the protection material, wherein an etch rate is higher in the non-memory area than in the memory area during the hard mask patterning and/or applying pillar etch.

Example 20a: The method of example 19a comprising: applying pillar etch on the memory material stack down to a top surface of the etch stop layer, wherein part of protection material is on part of the etch stop layer; and conformally depositing an encapsulation layer such that the encapsulation layer is adjacent to the protection material, the hard mask, the memory material stack, and the top surface of the etch stop layer.

Example 1b: An apparatus comprising: a first memory material stack; a first pedestal comprising metal connected to a first portion of the first memory material stack; a second memory material stack; a second pedestal comprising metal connected to a first portion of the second memory material stack; a hard mask having a first portion over the first memory material stack, wherein the hard mask having a second portion over the second memory material stack; and an encapsulation material coupled to the first memory material stack, the second memory material stack, the first portion of the hard mask, and the second portion of the hard mask.

Example 2b: The apparatus of example 1b comprising etch stop material coupled to a second portion of the first memory material stack, and a second portion of the second memory material stack.

Example 3b: The apparatus of example 2b, wherein the encapsulation material is coupled to the etch stop material.

Example 4b: The apparatus of example 1b, wherein the encapsulation material includes one of: AlxOy, HfOx, ZrOx, TaOx, TiOx, SiOx, SiN, SiCN, SiC, SiON, ALSiOx, HfSiOx, TaSiOx, AlN, ZrN, or HfN.

Example 5b: The apparatus of example 1b, wherein the hard mask includes one or more of: silicon dioxide (SiO2), silicon nitride (SixNy), SiC, SiNC, and photoimagable epoxy, AlxOy, TaN, W, SiN, SiON, SiC, and TiN, Tetra-ethyl Ortho-silicate (TEOS) or tetraethoxysilane (TEOS) bi-layer and tri-layer of these in any combination.

Example 6b: The apparatus of example 1b, wherein the first portion and the second portion of the hard mask are discontinuous.

Example 7b: The apparatus of example 1b, wherein the encapsulation material is completely between the first memory material stack and the second memory material stack.

Example 8b: The apparatus of example 1b, wherein the first memory material stack and the second memory material stack are separated by a region, wherein the region includes the encapsulation material connected to the first memory material stack, wherein the region includes the encapsulation material connected to the second memory material stack, and wherein the region includes an interlayer dielectric between the encapsulation material connected to the first memory material stack and the encapsulation material connected to the second memory material stack.

Example 9b: The apparatus of example 1b, wherein the first memory material stack or the second memory material stack comprises a capacitor.

Example 10b: The apparatus of example 1b, wherein the first memory material stack or the second memory material stack is part of dynamic random-access memory.

Example 11b: The apparatus of example 9b, wherein the capacitor comprises non-linear polar material which includes one of: ferroelectric material, paraelectric material, or non-linear dielectric.

Example 12b: The apparatus of example 11b, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 13b: The apparatus of example 11b, wherein the paraelectric material includes one or more of: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 14b: The apparatus of example 1b, wherein the first pedestal or the second pedestal include one or more of: Cu, Al, Ag, Au, Co, W, Fe, Ta, TaN, TiN, Ni, Ru, RuOx, Mo, doped poly silicon, or any combination of them.

Example 15b: The apparatus of example 1b, wherein the first memory material stack or the second memory material stack occupy a region reserved for via1 and metal 2.

Example 16b: The apparatus of example 1b, wherein the first memory material stack or the second memory material stack occupy a region reserved for via1 and metal 2, via2, and metal 3.

Example 17b: An apparatus comprising: a first memory material stack; a first pedestal comprising metal connected to a first portion of the first memory material stack; a second memory material stack; a second pedestal comprising metal connected to a first portion of the second memory material stack; a hard mask having a first portion over the first memory material stack, wherein the hard mask having a second portion over the second memory material stack; a protection material over the hard mask, the protection material having a first portion over the first portion of the hard mask, and a second portion over the second portion of the hard mask; and an encapsulation material coupled to the first memory material stack, the second memory material stack, the first portion of the hard mask, the second portion of the hard mask, the first portion of the protection material, and the second portion of the protection material.

Example 18b: The apparatus of example 17b wherein: the protection material includes one or more of: SiOx, SiN, Carbon doped Oxide, SiCN, SiC, SiON, HTCHM (high-temperature carbon hard mask), or AlxOy; the first pedestal or the second pedestal include one or more of: Cu, Al, Ag, Au, Co, W, Fe, Ta, TaN, TiN, Ni, Ru, RuOx, Mo, doped poly silicon, or any combination of them; the hard mask includes one or more of: silicon dioxide (SiO2), silicon nitride (SixNy), SiC, SiNC, and photoimagable epoxy, AlxOy, TaN, W, SiN, SiON, SiC, and TiN, Tetra-ethyl Ortho-silicate (TEOS) or tetraethoxysilane (TEOS) bi-layer and tri-layer of these in any combination; and the encapsulation material includes one of: AlxOy, HfOx, ZrOx, TaOx, TiOx, SiOx, SiN, SiCN, SiC, SiON, ALSiOx, HfSiOx, TaSiOx, AlN, ZrN, or HfN.

Example 19b: A system comprising: a memory to store one or more instructions; a processor circuitry to execute the one or more instructions; and a communicate interface to allow the processor circuitry to communicate with another device, wherein the processor circuitry includes: a first memory material stack; a first pedestal comprising metal connected to a first portion of the first memory material stack; a second memory material stack; a second pedestal comprising metal connected to a first portion of the second memory material stack; a hard mask having a first portion over the first memory material stack, wherein the hard mask having a second portion over the second memory material stack; and an encapsulation material coupled to the first memory material stack, the second memory material stack, the first portion of the hard mask, and the second portion of the hard mask.

Example 20b: The system of example 19b, wherein: the first pedestal or the second pedestal include one or more of: Cu, Al, Ag, Au, Co, W, Fe, Ta, TaN, TiN, Ni, Ru, RuOx, Mo, doped poly silicon, or any combination of them; the hard mask includes one or more of: silicon dioxide (SiO2), silicon nitride (SixNy), SiC, SiNC, and photoimagable epoxy, AlxOy, TaN, W, SiN, SiON, SiC, and TiN, Tetra-ethyl Ortho-silicate (TEOS) or tetraethoxysilane (TEOS) bi-layer and tri-layer of these in any combination; and the encapsulation material includes one of: AlxOy, HfOx, ZrOx, TaOx, TiOx, SiOx, SiN, SiCN, SiC, SiON, ALSiOx, HfSiOx, TaSiOx, AlN, ZrN, or HfN.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first memory material stack;
   a first pedestal comprising metal connected to a first portion of the first memory material stack;
   a second memory material stack;
   a second pedestal comprising metal connected to a first portion of the second memory material stack;
   a hard mask having a first portion over the first memory material stack, wherein the hard mask having a second portion over the second memory material stack; and
   an encapsulation material coupled to the first memory material stack, the second memory material stack, the first portion of the hard mask, and the second portion of the hard mask, wherein the encapsulation material completely fills a region between the first memory material stack and the second memory material stack.

2. The apparatus of claim 1 comprising etch stop material coupled to a second portion of the first memory material stack, and a second portion of the second memory material stack.

3. The apparatus of claim 2, wherein the encapsulation material is coupled to the etch stop material.

4. The apparatus of claim 1, wherein the encapsulation material includes one of: HfOx, ZrOx, TaOx, TiOx, SiOx, SiN, SiCN, SiC, AlxOy, SiON, ALSiOx, HfSiOx, TaSiOx, AlN, ZrN, or HfN.

5. The apparatus of claim 1, wherein the hard mask includes one or more of: silicon dioxide (SiO2), silicon nitride (SixNy), SiC, SiNC, and photoimagable epoxy, AlxOy, TaN, W, SiN, SiON, SiC, and TiN, Tetra-ethyl Ortho-silicate (TEOS) or tetraethoxysilane (TEOS) bi-layer and tri-layer of these in any combination.

6. The apparatus of claim 1, wherein the first portion and the second portion of the hard mask are discontinuous.

7. The apparatus of claim 1, wherein the first memory material stack and the second memory material stack include linear dielectric.

8. The apparatus of claim 1, wherein the first memory material stack or the second memory material stack comprises a capacitor.

9. The apparatus of claim 1, wherein the first memory material stack or the second memory material stack is part of dynamic random-access memory.

10. The apparatus of claim 8, wherein the capacitor comprises non-linear polar material which includes one of: ferroelectric material, paraelectric material, or non-linear dielectric.

11. The apparatus of claim 10, wherein the ferroelectric material includes one of:
Bismuth ferrite (BFO) with a first doping material, wherein the first doping material is one of Lanthanum or elements from the lanthanide series of periodic table;
Lead zirconium titanate (PZT) or PZT with a second doping material, wherein the second doping material is one of La or Nb;
a relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
a perovskite which includes one of: BaTiO3, PbTiO3, KNbO3, or NaTaO3;
a hexagonal ferroelectric which includes one of: YMnO3 or LuFeO3;
hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
Hafnium (Hf), Zirconium (Zr), Aluminum (Al), Silicon (Si), their oxides or their alloyed oxides;
Hafnium oxides as Hf1-x Ex Oy, where E can be Al, Ca, Ce, Dy, Err, Gd, Ge, La, Sc, Si, Sr, Sn, Zr, or Y;
Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' or 'y' is a fraction;
Niobate type compounds LiNbO3, LiTaO3, Lithium iron Tantalum Oxy Fluoride, Barium Strontium Niobate, Sodium Barium Niobate, or Potassium strontium niobate; or
improper ferroelectric includes one of: [PTO/STO]n or [LAO/STO]n, where 'n' is between 1 to 100.

12. The apparatus of claim 10, wherein the paraelectric material includes one or more of: SrTiO3, Ba(x)Sr(y)TiO3, HfZrO2, Hf—Si—O, La-substituted PbTiO3, or PMN-PT based relaxor ferroelectrics.

13. The apparatus of claim 1, wherein the first pedestal or the second pedestal include one or more of: Cu, Al, Ag, Au, Co, W, Fe, Ta, TaN, TiN, Ni, Ru, RuOx, Mo, doped poly silicon, or any combination of them.

14. The apparatus of claim 1, wherein the first memory material stack or the second memory material stack occupy a region of a die which is otherwise reserved for via1 and metal 2 layer.

15. The apparatus of claim 1, wherein the first memory material stack or the second memory material stack occupy a region of a die which is otherwise reserved for via1, metal 2 layer, via2, and metal 3 layer.

16. An apparatus comprising:
a first memory material stack;
a first pedestal comprising metal connected to a first portion of the first memory material stack;
a second memory material stack;
a second pedestal comprising metal connected to a first portion of the second memory material stack;
a hard mask having a first portion over the first memory material stack, wherein the hard mask having a second portion over the second memory material stack;
a protection material over the hard mask, the protection material having a first portion over the first portion of the hard mask, and a second portion over the second portion of the hard mask; and
an encapsulation material coupled to the first memory material stack, the second memory material stack, the first portion of the hard mask, the second portion of the hard mask, the first portion of the protection material, and the second portion of the protection material, wherein the encapsulation material fills a region between the first memory material stack and the second memory material stack.

17. The apparatus of claim 16 wherein:
the protection material includes one or more of: SiOx, SiN, Carbon doped Oxide, SiCN, SiC, SiON, HTCHM (high-temperature carbon hard mask), or AlxOy;
the first pedestal or the second pedestal include one or more of: Cu, Al, Ag, Au, Co, W, Fe, Ta, TaN, TiN, Ni, Ru, RuOx, Mo, doped poly silicon, or any combination of them;
the hard mask includes one or more of: silicon dioxide (SiO2), silicon nitride (SixNy), SiC, SiNC, and photoimagable epoxy, TaN, W, SiN, SiON, SiC, AlxOy, and TiN, Tetra-ethyl Ortho-silicate (TEOS) or tetraethoxysilane (TEOS) bi-layer and tri-layer of these in any combination; and
the encapsulation material includes one of: HfOx, ZrOx, TaOx, TiOx, SiOx, SiN, SiCN, SiC, AlxOy, SiON, ALSiOx, HfSiOx, TaSiOx, AlN, ZrN, or HfN.

18. A system comprising:
a memory to store one or more instructions;
a processor circuitry to execute the one or more instructions; and
a communicate interface to allow the processor circuitry to communicate with another device, wherein the processor circuitry includes:
a first memory material stack;
a first pedestal comprising metal connected to a first portion of the first memory material stack;
a second memory material stack;

a second pedestal comprising metal connected to a first portion of the second memory material stack;

a hard mask having a first portion over the first memory material stack, wherein the hard mask having a second portion over the second memory material stack; and an encapsulation material coupled to the first memory material stack, the second memory material stack, the first portion of the hard mask, and the second portion of the hard mask, wherein the encapsulation material completely fills a region between the first memory material stack and the second memory material stack.

19. The system of claim 18, wherein:

the first pedestal or the second pedestal include one or more of: Cu, Al, Ag, Au, Co, W, Fe, Ta, TaN, TiN, Ni, Ru, RuOx, Mo, doped poly silicon, or any combination of them;

the hard mask includes one or more of: silicon dioxide (SiO2), silicon nitride (SixNy), SiC, SiNC, and photo-imagable epoxy, AlxOy, TaN, W, SiN, SiON, SiC, and TiN, Tetra-ethyl Ortho-silicate (TEOS) or tetraethoxysilane (TEOS) bi-layer and tri-layer of these in any combination; and the encapsulation material includes one of: HfOx, ZrOx, TaOx, TiOx, SiOx, SiN, SiCN, SiC, AlxOy, SiON, ALSiOx, HfSiOx, TaSiOx, AlN, ZrN, or HfN.

* * * * *